US008957532B2

(12) United States Patent
Takahashi et al.

(10) Patent No.: US 8,957,532 B2
(45) Date of Patent: Feb. 17, 2015

(54) RESIN COMPACT, METHOD FOR PRODUCING RESIN COMPACT, RESIN COMPOSITION, METHOD FOR PRODUCING RESIN COMPOSITION AND ELECTRONIC COMPONENT DEVICE

(75) Inventors: Yoshiyuki Takahashi, Tokyo (JP); Hiroshi Utsugi, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 5 days.

(21) Appl. No.: 13/814,968

(22) PCT Filed: Aug. 30, 2011

(86) PCT No.: PCT/JP2011/069568
§ 371 (c)(1),
(2), (4) Date: Mar. 5, 2013

(87) PCT Pub. No.: WO2012/029762
PCT Pub. Date: Mar. 8, 2012

(65) Prior Publication Data
US 2013/0187296 A1 Jul. 25, 2013

(30) Foreign Application Priority Data

Sep. 2, 2010 (JP) ................................ 2010-196302
Aug. 26, 2011 (JP) ................................ 2011-185271

(51) Int. Cl.
*H01L 23/29* (2006.01)
*B29C 43/02* (2006.01)
*C08G 59/40* (2006.01)
*C08G 59/68* (2006.01)
*B29B 7/00* (2006.01)

(52) U.S. Cl.
CPC .............. *B29C 43/02* (2013.01); *H01L 23/295* (2013.01); *H01L 23/296* (2013.01); *C08G 59/40* (2013.01); *C08G 59/68* (2013.01); *B29B 7/002* (2013.01); *H01L 23/293* (2013.01)
USPC ........................................................ 257/793

(58) Field of Classification Search
CPC ............................ H01L 23/295; H01L 23/296
USPC ................................................. 257/793; 51/298
See application file for complete search history.

(56) References Cited

U.S. PATENT DOCUMENTS 5,089,032 A * 2/1992 Moran ............................. 51/293

FOREIGN PATENT DOCUMENTS

| JP | 59-191715 A | 10/1984 |
| JP | 63-277225 A | 11/1988 |
| JP | 3-211 A | 1/1991 |
| JP | 11-5888 A | 1/1999 |
| JP | 2001-189333 A | 7/2001 |
| JP | 2007077333 A * | 3/2007 |

OTHER PUBLICATIONS

International Search Report for PCT/JP2011/069568 mailed on Dec. 6, 2011.

* cited by examiner

*Primary Examiner* — Brook Kebede
(74) *Attorney, Agent, or Firm* — Birch, Stewart, Kolasch & Birch, LLP

(57) ABSTRACT

The present invention is related to a method for producing a resin compact containing an epoxy resin, a curing agent, a curing accelerator and an inorganic filler. The method includes a kneading and crushing process for preparing a first powder material obtained by mixing, heat-melting, kneading and crushing a first component containing the epoxy resin and the curing agent and the inorganic filler, but not containing the curing accelerator; a pulverizing process for preparing a second powder material obtained by pulverizing a second component containing the curing accelerator; a mixing process for preparing a resin composition by dispersing and mixing the first powder material and the second powder material; and a molding process for obtaining the resin compact by compression-molding the resin composition. This makes it possible to obtain a resin compact (particularly, a resin compact for encapsulation) having superior long term storage stability at room temperature, good curable property and fluidity.

17 Claims, 2 Drawing Sheets

R E S I N COMPACT, METHOD FOR PRODUCING RESIN COMPACT, RESIN COMPOSITION, METHOD FOR PRODUCING RESIN COMPOSITION AND ELECTRONIC COMPONENT DEVICE

The present invention is related to a resin compact, a method for producing the resin compact, a resin composition, a method for producing the resin composition and an electronic component device, and more particularly to a resin compact having superior long term storage stability at room temperature, good curable property and fluidity, a method for producing the resin compact, a resin composition for producing the resin compact and a method for producing the resin composition.

BACKGROUND OF THE INVENTION

An electronic device such as an IC, a LSI or a discrete semiconductor is mainly encapsulated with an epoxy resin by a transfer molding method. The transfer molding method has been usually used for such encapsulation because the transfer molding method is superior in terms of cost performance, reliability and productivity. In the majority transfer molding methods, it is general that an epoxy resin composition having a tablet shape (resin compact) is molded by putting the resin compact into a pot provided in a molding tool, compressing the resin compact by a plunger with being heat-melted, transferring the resin compact into a mold cavity, and then curing.

The epoxy resin composition contains an epoxy resin, a curing agent, a curing accelerator and an inorganic filler. The epoxy resin composition is prepared by mixing these materials which respectively have predetermined weights, heat-melting and kneading a mixture of the materials with a kneading machine, pulverizing the kneaded mixture (material) after the kneaded mixture is cooled, and then molding the pulverized mixture into the tablet shape. After preparing the epoxy resin composition, the prepared epoxy resin composition is stored in a low-temperature room (chamber). Further, it is general that the stored epoxy resin composition is brought out from the low-temperature room and maintained at room temperature until a temperature of the stored epoxy resin composition rises to room temperature before using the stored epoxy resin composition. In a case where overall process of heat-melting, kneading, cooling, pulverizing and molding the epoxy resin composition takes a long time, it is necessary to store the epoxy resin composition in the low-temperature room in which a temperature is adjusted to fall within the range of −20 to 10° C. for preventing deterioration of the epoxy resin composition. Further, it is also necessary to maintain the stored epoxy resin composition at room temperature for approximately ten-plus hours before using the stored epoxy resin composition. Furthermore, in a case where all of the epoxy resin composition is used in the process of molding (in one time), there is no problem. However, if a part of the epoxy resin composition is not used in one time, it is necessary to store the remaining epoxy resin composition in the low-temperature room again. If it is not done, fluidity of the epoxy resin composition significantly deteriorates depending on a storage term. If the stored epoxy resin composition which is not maintained at room temperature for sufficient time is used, the epoxy resin composition absorbs dew condensation water due to a temperature environment difference. This causes handling problems such as generation of voids, deterioration of curable property. For these reasons, it is difficult to reduce cost and man power for producing the resin compacts as well as to improve productivity thereof. Therefore, it is desirable to develop an epoxy resin composition that can be stored at approximate room temperature (in the range of approximately 20 to 25° C.)

In order to resolve the above problem, it is suggested to mold an improved compact with the transfer molding method. The compact is prepared by mixing a first component and a second component and then molding a mixture thereof into a tablet shape. The first component is prepared by mixing, heat-melting, kneading and then pulverizing an epoxy resin and an inorganic filler. The second component is prepared by mixing, heat-melting, kneading and then pulverizing a phenol resin, a curing accelerator and an inorganic filler. For example, see the following patent document 1. In this method, while it is possible to mold the compact, there is a case where curing reactions between the epoxy resin and the phenol resin become insufficient, which results in poor curable property, so that cracks, blisters and the like are likely to occur in the compact.

The problem of the poor curable property may be resolved by using a screw line type injection molding machine. However, this means that new equipment has to be introduced. Therefore, this approach is not realistic way.

PRIOR ART DOCUMENT

Patent Document

Patent document 1: JP H11-5888A

SUMMARY OF THE INVENTION

It is an object of the present invention to provide a resin compact (particularly, a resin compact for encapsulation) having superior long term storage stability at room temperature, good curable property and fluidity, a method for producing the resin compact, a resin composition for producing the resin compact, a method for producing the resin composition and an electronic component device using the resin compact.

The above object is achieved by the present invention which is specified in the following.

(1) A method for producing a resin compact containing an epoxy resin, a curing agent, a curing accelerator and an inorganic filler, the method comprising:

a kneading and crushing process for preparing a first powder material obtained by mixing, heat-melting, kneading and crushing a first component containing the epoxy resin, the curing agent and the inorganic filler, but not containing the curing accelerator;

a pulverizing process for preparing a second powder material obtained by pulverizing a second component containing the curing accelerator;

a mixing process for preparing a resin composition by dispersing and mixing the first powder material and the second powder material at a temperature lower than melting temperatures or softening temperatures of the epoxy resin, the curing agent and the curing accelerator; and a molding process for obtaining the resin compact by compression-molding the resin composition in a state that a temperature of the resin composition is lower than the melting temperatures or the softening temperatures of the epoxy resin, the curing agent and the curing accelerator, wherein the epoxy resin, the curing agent and the curing accelerator are allowed not to be heated at a temperature equal to or higher than the melting temperatures or the softening temperatures thereof during the above processes.

(2) The method described in above (1), wherein the resin compact is a resin tablet for encapsulation.

(3) The method described in above (1) or (2), wherein the curing accelerator contained in the second powder material is comprised of particles having a median diameter of equal to or smaller than 20 μm, wherein the particles of the curing accelerator include large-sized particles having a diameter of equal to or larger than 50 μm, and wherein a ratio of an amount of the large-sized particles with respect to a total amount of the particles of the curing accelerator is equal to or less than 10%.

(4) The method described in any one of above (1) to (3), wherein the pulverizing process is carried out by using at least one selected from the group comprising a jet mill, a boll mill, a hammer mill and a pot mill.

(5) The method described in any one of above (1) to (4), wherein the resin composition further contains a release agent, and wherein the second powder material further contains at least one of a part of the epoxy resin, a part of the curing agent, a part of the inorganic filler and a part of the release agent.

(6) The method described in any one of above (1) to (5), wherein the first powder material has a median diameter of equal to or smaller than 200 μm.

(7) The method described in any one of above (1) to (6), wherein the mixing process is carried out by using at least one selected from the group comprising a rotating type mixer and a dispersed movement type mixer.

(8) The method described in any one of above (1) to (7), wherein the curing accelerator contains at least one selected from the group comprising a tetra-substituted phosphonium compound, a phosphobetaine compound, an adduct of a phosphine compound and a quinone compound and an adduct of a phosphonium compound and a silane compound.

(9) A resin compact obtained by the method described in any one of above (1) to (8), wherein an increasing rate of viscosity of the resin compact measured by a Koka-type flow tester (constant-load orifice-type flow tester) is equal to or less than 20% after the resin compact is stored for thirty days under conditions that a temperature is 30° C. and a relative humidity is 50% RH.

(10) A method for producing a resin composition containing an epoxy resin, a curing agent, a curing accelerator and an inorganic filler, the method comprising:

a kneading and crushing process for preparing a first powder material obtained by mixing, heat-melting, kneading and crushing a first component containing the epoxy resin, the curing agent and the inorganic filler, but not containing the curing accelerator;

a pulverizing process for preparing a second powder material obtained by pulverizing a second component containing the curing accelerator; and a mixing process for obtaining the resin composition by dispersing and mixing the first powder material and the second powder material at a temperature lower than melting temperatures or softening temperatures of the epoxy resin, the curing agent and the curing accelerator;

wherein the epoxy resin, the curing agent and the curing accelerator are allowed not to be heated at a temperature equal to or higher than the melting temperatures or the softening temperatures thereof during the above processes.

(11) A resin composition obtained by the method described above (10), wherein an increasing rate of viscosity of the resin composition measured by a Koka-type flow tester (constant-load orifice-type flow tester) is equal to or less than 20% after the resin compact is stored for thirty days under conditions that a temperature is 30° C. and a relative humidity is 50% RH.

(12) An electronic component device comprising:

a semiconductor element encapsulated with the resin compact described above (9) or the resin composition described above (11) without molding.

According to the present invention, it is possible to produce the resin compact or the resin composition without heat-melting and kneading the curing accelerator with a kneading machine. As a result, it is possible to improve long term storage stability at room temperature of the resin compact or the resin composition. This makes it possible to reduce preservation cost and transportation cost of the resin compact or the resin composition. Further, it is possible to maintain the same moldability (more particularly, fluidity) and curable property as the existing product. For the reasons stated above, the present invention is industrially applicable.

DETAILED DESCRIPTION OF THE PREFFERED EMBODIMENT

A method for producing a resin compact according to the present invention is a method for producing a resin compact containing an epoxy resin, a curing agent, a curing accelerator and an inorganic filler. The method comprises a kneading and crushing process for preparing a first powder material obtained by mixing, heat-melting, kneading and crushing a first component containing the epoxy resin, the curing agent and the inorganic filler, but not containing the curing accelerator;

a pulverizing process for preparing a second powder material obtained by pulverizing a second component containing the curing accelerator;

a mixing process for preparing a resin composition by dispersing and mixing the first powder material and the second powder material at a temperature lower than melting temperatures or softening temperatures of the epoxy resin, the curing agent and the curing accelerator; and a molding process for obtaining the resin compact by compression-molding the resin composition in a state that a temperature of the resin composition is lower than the melting temperatures or the softening temperatures of the epoxy resin, the curing agent and the curing accelerator, wherein the epoxy resin, the curing agent and the curing accelerator are allowed not to be heated at a temperature equal to or higher than the melting temperatures or the softening temperatures thereof during the above processes.

This makes it possible to obtain the resin compact having superior long term storage stability at room temperature, good curable property and fluidity. Further, an electronic component device according to the present invention comprises a semiconductor element encapsulated with the resin compact described above. Hereinafter, the present invention will be described in detail.

Figure 1:
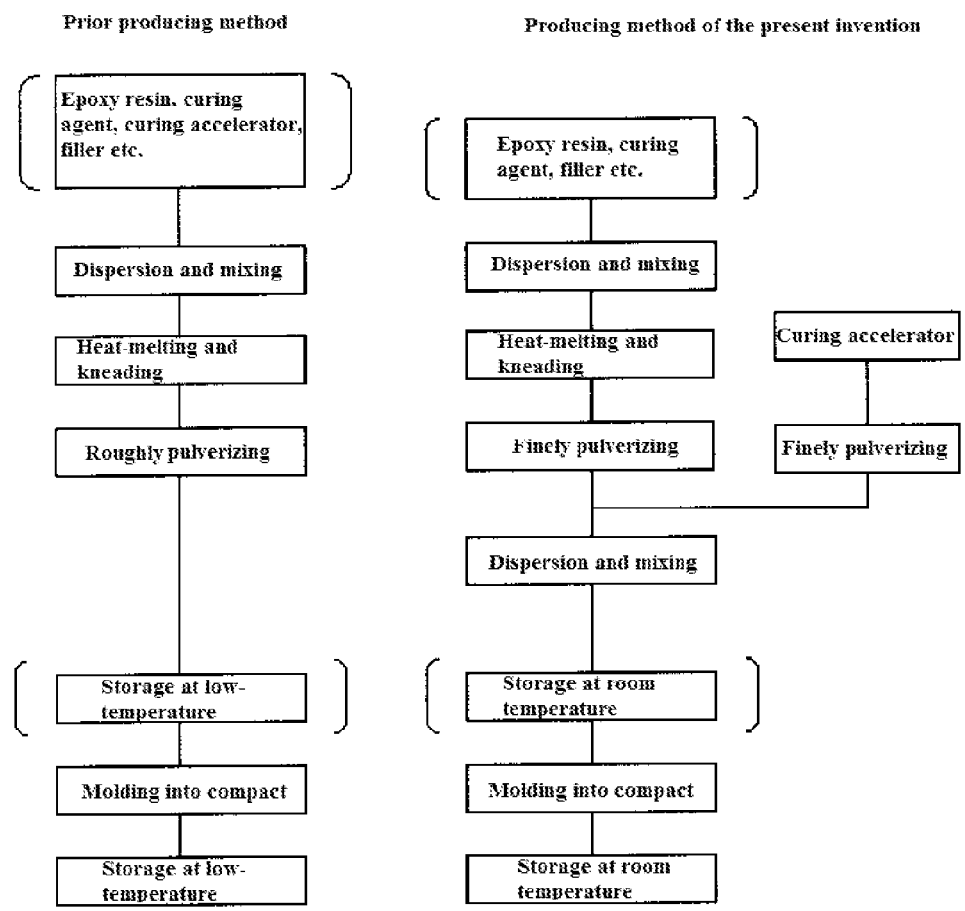
FIG. 1 is schematic process charts showing a prior art and an example of a method for producing a resin compact according to the present invention.

FIG. 1 is schematic process charts showing a prior art and an example of a method for producing a resin compact according to the present invention.

A resin compact of the present invention contains an epoxy resin, a curing agent, a curing accelerator and an inorganic filler. As shown in FIG. 1, a method for producing the resin compact comprises a kneading and crushing process for preparing a first powder material obtained by mixing, heat-melting, kneading and crushing a first component containing the epoxy resin, the curing agent and the inorganic filler, but not containing the curing accelerator;

a pulverizing process for preparing a second powder material obtained by pulverizing a second component containing the curing accelerator;

a mixing process for preparing a resin composition by dispersing and mixing the first powder material and the second powder material at a temperature lower than melting temperatures or softening temperatures of the epoxy resin, the curing agent and the curing accelerator; and a molding process for obtaining the resin compact by compression-molding the resin composition in a state that a temperature of the resin composition is lower than the melting temperatures or the softening temperatures of the epoxy resin, the curing agent and the curing accelerator.

In this method, the epoxy resin, the curing agent and the curing accelerator are allowed not to be heated at a temperature equal to or higher than the melting temperatures or the softening temperatures thereof during the above processes.

In particular, the method comprises the mixing process for preparing the resin composition by dispersing and mixing the first powder material and a pulverized curing accelerator (the second powder material) at the temperature lower than the melting temperatures or the softening temperatures of the epoxy resin, the curing agent and the curing accelerator so that the first powder material and the pulverized curing accelerator (the second powder material) are not compatibly melted together during this process; and the molding process for obtaining the resin compact by compression-molding the resin composition in a state that the temperature of the resin composition is lower than the melting temperatures or the softening temperatures of the epoxy resin, the curing agent and the curing accelerator without heating the resin composition.

This makes it possible to obtain the resin compact without heating a mixture of the curing accelerator, the epoxy resin and curing agent over the melting temperatures or the softening temperatures of the epoxy resin, the curing agent and the curing accelerator. As a result, it is possible to obtain the resin composition having superior long term storage stability, the same moldability (more particularly, fluidity) and curable property as a resin compact for encapsulation produced by the prior art, regardless of the kind of the curing accelerator. Therefore, even in a case where overall process takes a long time, it is unnecessary to store the resin compact at a low temperature of approximately −20 to 10° C. after molding the resin compact. Further, it is also unnecessary to maintain the stored resin composition at room temperature for approximately ten-plus hours before using the stored composition (namely, before the stored composition is formed and molded with a molding method such as a transfer molding method or a compression molding method). Furthermore, since the second powder material containing the curing accelerator is preliminary pulverized before the second powder material is used, it is possible to provide sufficient fluidity even in a case where the heat-melting, kneading or heating process for molding the resin compact is not carried out.

Description will be first given to each component contained in the resin composition constituting the resin compact. The epoxy resin contained in the resin composition constituting the resin compact of the present invention is, generally, a monomer, an oligomer and a polymer each having two or more epoxy groups in one molecule thereof. Examples of such an epoxy resin include a biphenyl type epoxy resin, a phenol aralkyl epoxy resin having a phenylene or biphenylene chemical structure, an orthocresol novolac type epoxy resin, a dicyclopentadiene modified phenol type epoxy resin, a naphthol type epoxy resin, a triphenol methane type epoxy resin and the like. From viewpoints of storage stability and workability, a melting temperature or a softening temperature of the epoxy resin is preferably equal to or higher than 40° C., and more preferably equal to or higher than 50° C. Further, from a viewpoint of fluidity, the melting temperature or the softening temperature of the epoxy resin is preferably equal to or lower than 150° C., and more preferably equal to or lower than 120° C.

A lower limit of an amount of the epoxy resin with respect to a total amount of the resin composition constituting the resin compact of the present invention is not particularly limited to a specific value, but is preferably equal to or more than 1.5 wt %, and more preferably equal to or more than 3 wt %. On the other hand, an upper limit of the amount of the epoxy resin with respect to the total amount of the resin composition is not particularly limited to a specific value, but preferably equal to or less than 20 wt %, and more preferably equal to or less than 15 wt %.

The curing agent contained in the resin composition constituting the resin compact of the present invention is, generally, a monomer, an oligomer and a polymer each having two or more phenolic hydroxyl groups in one molecule thereof. Examples of such a curing agent include a phenol novolac resin, a cresol novolac resin, a phenol aralkyl resin having a phenylene or biphenylene chemical structure, a naphthol aralkyl resin, a terpene modified phenol resin, dicyclopentadiene modified phenol resin and the like. From viewpoints of storage stability and workability, a melting temperature or a softening temperature of the curing agent is preferably equal to or higher than 40° C., and more preferably equal to or higher than 50° C. Further, from a viewpoint of fluidity, the melting temperature or the softening temperature of the curing agent is preferably equal to or lower than 150° C., and more preferably equal to or lower than 120° C.

A lower limit of an amount of the curing agent with respect to the total amount of the resin composition constituting the resin compact of the present invention is not particularly limited to a specific value, but is preferably equal to or more than 0.8 wt %, and more preferably equal to or more than 1.5 wt %. On the other hand, an upper limit of the amount of the curing agent with respect to the total amount of the resin composition constituting the resin compact of the present invention is not particularly limited to a specific value, but preferably equal to or less than 15 wt % with respect to the total amount of the resin composition, and more preferably equal to or less than 12 wt %.

It is preferable to mix the epoxy resin and the phenol resin used as the curing agent so as to set an equivalence ratio (EP)/(OH) of a total number of the epoxy groups (EP) contained in the epoxy resin to a total number of the phenolic hydroxyl groups (OH) contained in the phenol resin to fall within the range of 0.8 to 1.3. By setting the equivalence ratio to fall within the above range, it is possible to provide an enough curable property for molding the resin composition.

The curing accelerator contained in the resin composition constituting the resin compact of the present invention is not particularly limited to a specific material, as long as it can accelerate the reaction of the epoxy group and the phenolic hydroxyl group. Examples of such an curing accelerator include an amine type compound such as a tertiary amine including a monocyclic or dicyclic type amidine (e.g., 1,8-diazabicyclo [5,4,0]undecene -7, imidazole and the like) or a hydrochloride salt thereof; a phosphorous compound such as an organic phosphine (e.g., a tripheny phosphine and the like), a tetra-substituted phosphonium compound (e.g., a tetra-substituted phosphonium tetra-substituted borate, a tetra-substituted phosphonium organic acid salt produced by reacting a tetra-substituted phosphonium with a phenolic compound or a carboxylic compound with releasing a proton thereof, a molecular compound produced by adding one or more organic acid to the tetra-substituted phosphonium organic acid salt and the like), a phosphobetaine compound, an adduct of a phosphine compound and a quinone compound, an adduct of a phosphine compound and a silane compound; and the like. Among these material, from viewpoints of fluidity, storage stability and workability, the curing accelerator is preferably at least one compound selected from the group comprising the tetra-substituted phosphonium compound, the phosphobetaine compound, the adduct of the phosphine compound and the quinone compound and the adduct of the phosphonium compound and the silane compound. In a case of focusing on the fluidity, the tetra-substituted phosphonium compound is more preferable. In another case of focusing on suppression of thermal elastic modulus (elastic modulus at higher temperature) of the cured resin composition for encapsulation, the phosphate compound or the adduct of the phosphine compound and the quinone compound is more preferable. In another case of focusing on a potentially curable property, the adduct of the phosphoniumu compound and the silane compound is more preferable.

The tetra-substituted phosphonium compound is, for example, represented by the following general formula (1).

[Formula 1]

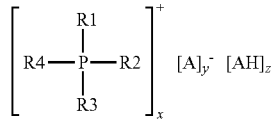

(1)

Wherein "P" is a phosphorus atom, each of R1, R2, R3 and R4 is an aromatic group or an alkyl group, "A" is an anion of an aromatic organic acid having an aromatic ring to which at least one functional group selected from a hydroxyl group, a carboxyl group and a thiol group is bonded, "AH" is an aromatic organic acid having an aromatic ring to which at least one functional group selected from a hydroxyl group, a carboxyl group and a thiol group is bonded, each of "x" and "y" is an integer of 1 to 3, "z" is an integer of 0 to 3, and "x" is equal to "y".

In the compound represented by the general formula (1), it is preferred that each of R1, R2, R3 and R4 bonded to the phosphorus atom is a phenyl group, "AH" is a phenolic compound having an aromatic ring to which a hydroxyl group is bonded, and "A" is an anion of the phenolic compound. Examples of such an phenolic compound in the present invention include a monocyclic phenolic compound such as phenol, cresol, resorcin or catechol; a fused polycyclic phenolic compound such as naphthol, dihydroxynaphthalene or anthraquinol; a bisphenolic compound such as bisphenol A, bisphenol F or bisphenol S; a polycyclic phenolic compound such as phenyl phenol or biphenol; and the like.

The phosphobetaine compound is, for example, represented by the following general formula (2).

[Formula 2]

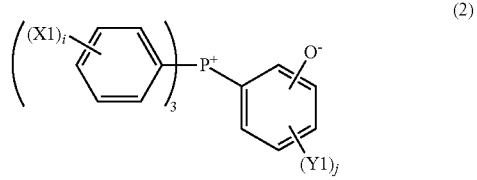

(2)

Wherein X1 is an alkyl group having carbon number of 1 to 3, Y1 is a hydroxyl group, "i" is an integer of 0 to 5, and "j" is an integer of 0 to 4.

The adduct of the phosphine compound and the quinone compound is, for example, represented by the following general formula (3).

[Formula 3]

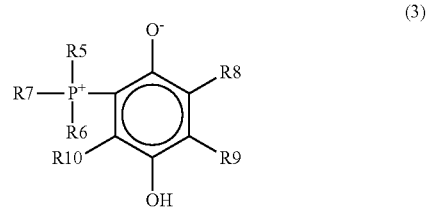

(3)

Wherein "P" is a phosphorus atom, each of R5, R6 and R7 is an alkyl group having carbon number of 1 to 12 or an aryl group having carbon number of 6 to 12 and is the same or different from each other, each of R8, R9 and R10 is a hydrogen atom or a hydrocarbon group having carbon number 1 to 12 and is the same or different from each other, and R8 may be bonded to R9 to form a cyclic structure.

As the phosphine compound used for producing such an adduct of the phosphine compound and the quinone compound, it is preferable that a phosphine compound having a non-substituted aromatic ring or a substituted aromatic ring containing a substituent group such as an alkyl group or an alkoxyl group such as triphenyl phosphine, tris(alkylphenyl) phosphine, trinaphthyl phosphine, tris(benzyl)phosphine or the like. Examples of the substituent group include an alkyl group or an alkoxyl group having carbon number of 1 to 6. From a viewpoint of ready availability, the triphenyl phosphine is preferably used as the phosphine compound. Further, as the quinone compound used for producing the adduct of the phosphine compound and the quinone compound, it is preferable that o-benzoquinone, p-benzoquinone or an anthraquinone compound. From a viewpoint of preservation stability, the p-benzoquinone is preferably used as the quinone compound. It is preferable to use a compound represented by the general formula (3) in which each of R5, R6 and R7 bonded to the phosphorus atoms is a phenyl group and each of R8, R9 and R10 is a hydrogen atom, that is, a compound produced by adding 1,4-benzoquinone to triphenly phosphine. This makes it possible to maintain a low thermal elastic modulus (elastic modulus at higher temperature) of the cured resin composition for encapsulating.

The adduct of the phosphonium compound and the silane compound is, for example, represented by the following general formula (4).

[Formula 4]

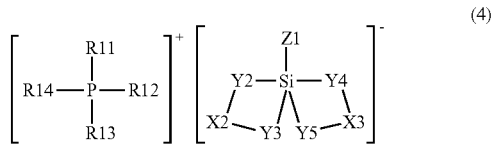

Wherein "P" is a phosphorus atom, "Si" is a silicon atom, and each of R11, R12, R13 and R14 is an organic group having an aromatic ring or a heterocyclic ring, or an aliphatic group, and is the same or different from each other. "X2" is an organic group through which "Y2" and "Y3" are bonded to each other. "X3" is an organic group through which "Y4" and "Y5" are bonded to each other. Each of "Y2" and "Y3" is a group obtained by releasing protons from a proton-donating group and is bonded to the silicon atom contained in the same molecular to form a chelate structure. Each of "Y4" and "Y5" is a group obtained by releasing protons from a proton-donating group and is bonded to the silicon atom contained in the same molecular to form a chelate structure. Each of "X2" and "X3" is the same or different from each other. Each of "Y2", "Y3", "Y4" and "Y5" is the same or different from each other. "Z1" is an organic group having an aromatic ring or a heterocyclic ring, or an aliphatic group.

In the general formula (4), examples of each of R11, R12, R13 and R14 include a phenyl group, a methyl phenyl group, a methoxyphenyl group, a hydroxyphenyl group, a naphthyl group, a hydroxynaphthyl group, a benzyl group, a methyl group, an ethyl group, a n-butyl group, a n-octyl group, a cyclohexyl group and the like. Among these groups, an aromatic group having a substituent group such as the phenyl group, the methyl phenyl group, the methoxyphenyl group, the hydroxyphenyl group, the hydroxynaphthyl group or the like, or a non-substituted aromatic group is preferably used.

Further, in the general formula (4), "X2" is the organic group through which "Y2" and "Y3" are bonded to each other. Similarly, "X3" is the organic group through which "Y4" and "Y5" are bonded to each other. Each of "Y2" and "Y3" is the group obtained by releasing protons from the proton-donating group and is bonded to the silicon atom contained in the same molecular to form the chelate structure. Similarly, each of "Y4" and "Y5" is the group obtained by releasing protons from the proton-donating group and is bonded to the silicon atom contained in the same molecular to form the chelate structure. Each of "X2" and "X3" is the same or different from each other. Each of "Y2", "Y3", "Y4" and "Y5" is the same or different from each other. A group represented by —Y2-X2-Y3- or —Y4-X3-Y5- in the general formula (4) is composed of a group obtained by releasing two protons from a proton-donor. As the proton-donor, it is preferable that, for example, an organic acid containing two or more carboxyl groups and/or hydroxyl groups, more preferable that an aromatic compound containing an aromatic ring and two or more carboxyl groups or hydroxyl groups each bonded to carbon atoms constituting the aromatic ring, and even more preferable that an aromatic compound containing an aromatic ring and two or more hydroxyl groups bonded to adjacent carbon atoms constituting the aromatic ring.

Concrete examples of such an aromatic compound include catechol, pyrogallol, 1,2-dihydroxynaphthalene, 2,3-dihydroxynaphthalene, 2,2'-biphenol, 1-1'-bi-2-naphthol, salicylic acid, 1-hydroxy-2-naphthoic acid, 3-hydroxy-naphthoic acid, chloranilic acid, tannic acid, 2-hydroxybenzylalchol, 1,2-cyclohexanediol, 1,2-propanediol, glycerin and the like. Among these aromatic compounds, the catechol, the 1,2-dihydroxynaphthalene or 2,3-dihydroxynaphthalene is preferably used.

Further, "Z1" in the general formula (4) is an organic group having an aromatic ring or a heterocyclic ring, or an aliphatic group. Concrete examples of such an organic group include an aliphatic hydrocarbon group such as a methyl group, an ethyl group, a propyl group, a butyl group, a hexyl group or an octyl group; an aromatic hydrocarbon group such as a phenyl group, a benzyl group, a naphthyl group or a biphenyl group; a reactive substituent group such as a glycidyl oxypropyl group, a mercaptopropyl group, an aminopropyl group or a vinyl group; and the like. Among these organic groups, the methyl group, the ethyl group, the phenyl group, the naphthyl group or the biphenyl group is preferably used. This is because these groups can improve thermal stability of the adduct represented by the general formula (4).

An amount of the curing accelerator contained in the resin composition constituting the resin compact of the present invention with respect to a total amount of the resin composition is preferably in the range of 0.1 to 1.0 wt %. By setting the amount of the curing accelerator to fall within the above range, it is possible to provide sufficient fluidity, storage stability and curable property.

The inorganic filler contained in the resin composition constituting the resin compact of the present invention is not particularly limited to a specific material, and may be a common inorganic filler commonly used in this art. Examples of such an inorganic filler include a silicate such as talc, sintered clay, non-sintered clay, mica or glass; an oxide such as titanium oxide, alumina or silica powder (e.g., fused spherical silica, fused-crushed silica, crystal silica or the like); a carbonate such as calcium carbonate, magnesium carbonate or hydrotalcite; a hydroxide such as aluminum hydroxide, magnesium hydroxide or calcium hydroxide; a sulfate or sulfite such as barium sulfate, calcium sulfate or calcium sulfite; a borate such as zinc borate, barium metaborate, aluminum borate, calcium borate or sodium borate; a nitride such as aluminium nitride, boron nitride or silicon nitride; and the like. These inorganic fillers may be used singly or in combination of two or more of them. Among these inorganic fillers, the silica powder such as the fused silica, the fused-crushed silica or the crystal silica is preferably used, and the fused spherical silica is more preferably used. This makes it possible to improve heat resistance, moisture resistance and strength of the resin compact. A shape of the inorganic filler is not particularly limited to a specific shape, but is preferably a spherical shape. Further, it is preferred that a particle size distribution of the inorganic filler having the spherical shape is broad. This makes it possible to especially improve fluidity of the inorganic filler (resin composition).

An amount of the inorganic filler contained in the resin composition constituting the resin compact of the present invention with respect to a total amount of the resin composition is not particularly limited to a specific value, but is preferably equal to or more than 80 wt %, more preferably equal to or more than 83 wt %, and even more preferably equal to or more than 85%. By setting the amount of the inorganic filler to be equal to or more than the above limit, it is possible to suppress moisture absorption and strength degradation of the cured resin composition for encapsulation. An upper limit of the amount of the inorganic filler contained in the resin composition constituting the resin compact of the present invention with respect to the total amount of the resin composition is preferably equal to or less than 93 wt %, more preferably equal to or less than 91 wt %, and even more preferably equal to or less than 90 wt %. By setting the amount of the inorganic filler to be equal to or less than the above upper limit, it is possible to allow the produced resin composition to have superior fluidity and moldability. In a case of using an inorganic flame retardant such as an aluminum hydroxide or a magnesium hydroxide; a boric acid zinc; or a molybdenum acid zinc, it is preferable to set a total amount of the inorganic flame retardant and the inorganic filler within the above range.

The resin composition constituting the resin compact of the present invention contains the epoxy resin, the curing agent, the curing accelerator and the inorganic filler. If necessary, the resin composition may contain a flame retardant such as a brominated epoxy resin, antimony oxide, phosphoric acid ester, phosphazene, aluminum hydroxide or magnesium hydroxide; an ion scavenger such as hydrotalcite; a coloring agent such as carbon black, colcothar or titanium oxide; a natural wax such as carnauba wax; a synthesized wax such as polyethylene wax; a release agent such as a higher fatty acid or metallic salt thereof (e.g., stearic acid, zinc stearate or the like) or paraffin; a stress reducer such as silicone oil or silicone rubber; a silane coupling agent; or the like.

Next, description will be given to the method for producing the resin compact of the present invention by explaining an example method for producing a resin tablet (compact) for encapsulation.

(Kneading and Mixing Process)

This process is a process for preparing a first powder material obtained by mixing, heat-melting, kneading and crushing a first component containing the epoxy resin, the curing agent and the inorganic filler, but not containing the curing accelerator.

The first component is composed of all materials contained in the resin compact other than the curing accelerator. The mixing, heat-melting and kneading processes can be carried out by a general method used in the prior art.

The first component containing these materials is uniformly pulverized and mixed by using, for example, a mixer, a jet mill, a boll mill or the like. Then, the first component is kneaded with a kneading machine such as a heated roller, a kneader or an extruder with being heat-melted at about 90 to 120° C. The first powder material is prepared by cooling and pulverizing the kneaded first composition.

(Pulverizing Process)

The pulverizing process includes two pulverizing processes. One of the pulverizing processes is the above pulverizing process for preparing the first powder material by pulverizing the first component after the first component containing the epoxy resin, the curing agent and the inorganic filler, but not containing the curing accelerator is prepared by mixing, heat-melting and kneading in the kneading and mixing process explained above. The other one of the pulverizing processes is a pulverizing process for preparing a second powder material by pulverizing a second component containing the curing accelerator.

From a viewpoint of uniform dispersion, it is preferred that the first powder material is composed of particles having a median diameter of equal to or smaller than 200 μm, and a ratio of large-sized particles having a diameter of equal to or larger than 500 μm with respect to a total amount of the particles of the first powder material is equal to or less than 10 wt %. By setting the median diameter of the particles of the first powder material to be lower than the above upper limit (that is, 200 μm) and the ratio of the large size particles to fall below the above upper limit, it is possible to uniformly disperse the first powder material. As a result, it is possible to prevent poor curing.

It is also preferred that the curing accelerator contained in the second powder material is pulverized in order that the curing accelerator is composed of particles having a median diameter of equal to or smaller than 20 μm, and a ratio of large-sized particles having a diameter of equal to or larger than 50 μm with respect to a total amount of the particles of the curing accelerator is equal to or less than 10 wt %, and more preferred that the curing accelerator is composed of particles having a median diameter of equal to or smaller than 10 μm and a ratio of the large-sized particles having the diameter of equal to or larger than 50 μm with respect to the total amount of the particles of the curing accelerator is equal to or less than 5 wt %. By pulverizing the curing accelerator so as to set the median diameter of the particles of the curing accelerator to fall below the above upper limit (that is, 20 μm) and the ratio of the large-sized particles to fall below the above upper limit, it is possible to reduce possibilities of generations of voids and cracking caused by a partial reaction speed difference due to insufficient dispersion of the curing accelerator, insufficient (poor) curing reactions caused by insufficient reaction speed, and deterioration of fluidity caused by partial heterogeneous reaction progress. A particle size distribution can be measured with a laser type particle size analyzer (for example, SALD-7000 made by Shimadzu Corporation).

The pulverizing process can be carried out by using at least one of external forces selected from the group comprising compression force, impact force, shearing force and frictional force. In particular, the pulverizing process can be carried out by using a jet-type pulverizing machine such as a KRYPTON Zepros (made by Earthtechnica Corporation), a Wing mill (made by Sansho industry Corporation), a Mighty mill (made by Sansho industry Corporation) or a jet-mill; a ball mill such as a vibrating ball mill, a continuous rotating ball mill or a batch-type ball mill; a pot mill such as a pulverizer, a hammer mill or a planet pot mill; a roller mill or the like. Further, the pulverizing process may be carried out by using combination of two or more of these machines. Although the external force may be applied at ordinary temperatures, the pulverizing process may be carried out at low temperatures (namely, the pulverizing process may be carried out after a cooling or freezing process is carried out by using cooling or freezing means).

In order to pulverize the cooled resin composition (the first powder material) in the pulverizing process, the KRYPTON Zepros, the Wing mill or the Mighty mill is preferable, and the KRYPTON Zepros or the Wing mill is more preferable. These machines make it possible to easily set the particle size of the first powder material to fall within the above range. Further, it is possible to prepare the first powder material so as not to allow the first powder material (the first component) to be heated at a temperature equal to or higher than melting temperatures or softening temperatures of the epoxy resin and the curing agent.

Among these machines, it is preferred that the jet mill, the ball mill or the pot mill is used for pulverizing the second component, and more preferred that the jet mill is used for pulverizing the second component. This makes it possible to effectively pulverize the curing accelerator and easily set a particle size of the second powder material to fall within the above range. Further, it is possible to prepare the second powder material so as not to allow the second powder material (the second component) to be heated at a temperature equal to or higher than melting temperature or softening temperature of the curing accelerator.

Each of the Wing mill (made by Sansho industry Corporation) and the Mighty mill (made by Sansho industry Corporation) is a pulverizing machine used for preparing the first powder material which can finely pulverize the kneaded first component (the kneaded material) by crushing the kneaded material against a plurality of blades for pulverization.

Figure 2:
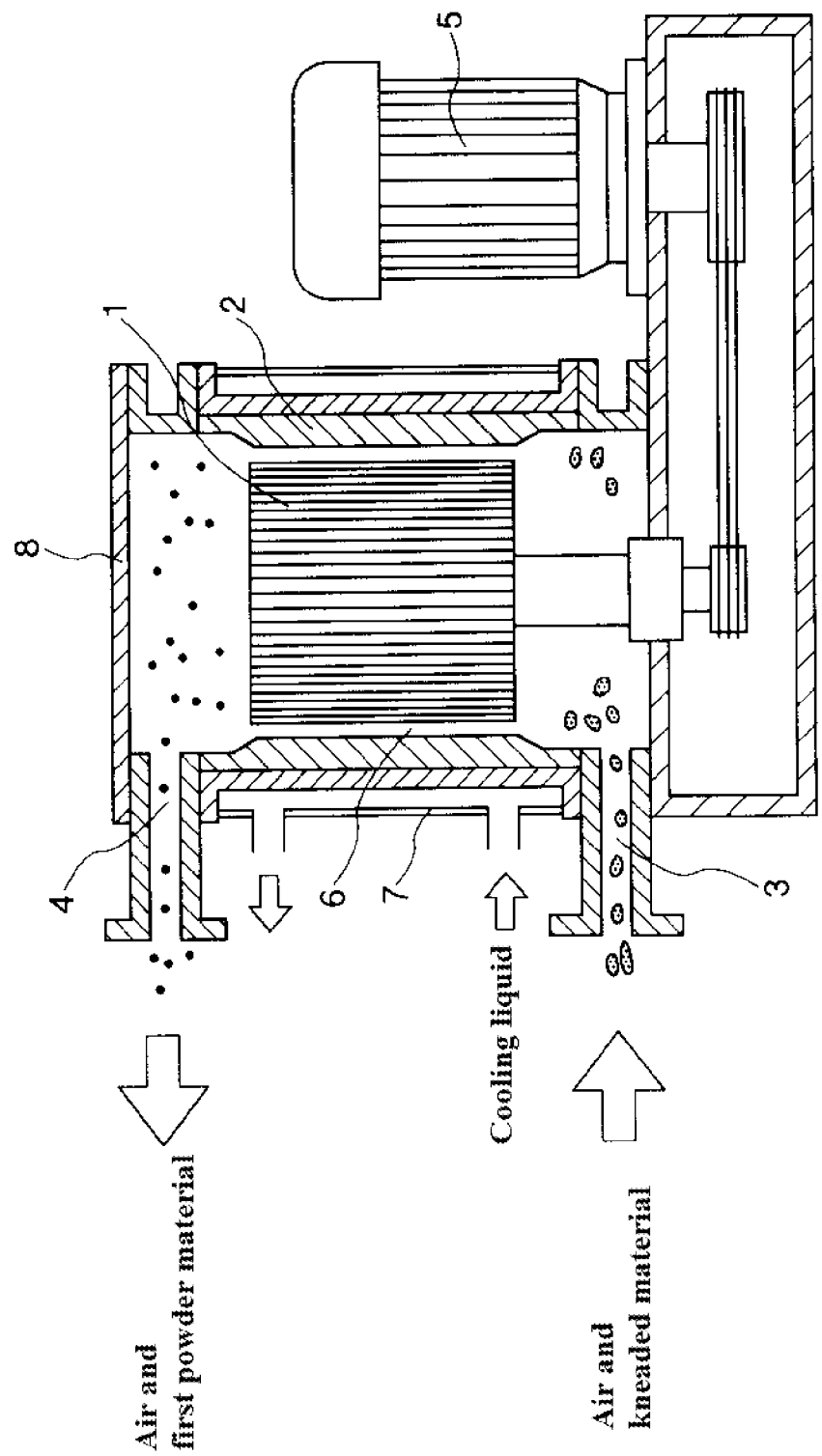
FIG. 2 is a structural view schematically showing a KRYPTON Zepros which is an example of a pulverizing machine.

The KRYPTON Zepros (made by Earthtechnica Corporation) is a pulverizing machine used for preparing the first powder material which can finely pulverize the kneaded first component (the kneaded material) between a rotor and a liner with shearing force and frictional force. As shown in FIG. 2, the KRYPTON Zepros includes a casing 8, a rotor 1 having a plurality of grooves, a motor 5 for rotating the rotor 1.

The casing 8 has an interior wall, an inlet 3 provided at a lower side portion of the casing 8, an outlet 4 provided at an upper side portion of the casing 8 and a stator 2 which is provided on a central portion of the interior wall of the casing 8 and has a plurality of grooves.

The rotor 1 is positioned at an approximate central part of the casing 8. A crushing area 6 for crushing the kneaded first component (the kneaded material) is defined by a space between the rotor 1 and the stator 2.

The rotor 1 is configured to be capable of being rotated by driving of the motor 5. The kneaded first component (the kneaded material) is supplied into the crushing area 6 during the rotor 1 being rotated. Then, the kneaded fist component (the kneaded material) is finely pulverized by shearing and crushing it. As a result, the first powder material is obtained.

The kneaded first component (the kneaded material) is supplied from the inlet 3 into the crushing area 6 by airflow. Then, the prepared first powder material is discharged from the outlet 4 by the airflow. During the pulverizing process, a temperature of the first powder material (the kneaded first component) rises due to heat generated when the kneaded first component (the kneaded material) is sheared and crushed. By cooling the airflow for delivering the kneaded first component and the first powder material, it is possible to reliably prevent or suppress temperature rising of the prepared first powder material due to the heat.

In the machine (the KRYPTON Zepros) shown in FIG. 2, a cooling jacket 7 is provided on an outer periphery portion of the casing 8. By supplying a coolant into the cooling jacket 7, it is possible to reliably prevent or suppress the temperature rising occurred by the heat.

As just described above, the KRYPTON Zepros has two cooling means. Therefore, it is possible to more accurately control temperature during the pulverizing process for preparing the first powder material.

In a case where the jet mill is used for pulverizing the second component containing the curing accelerator, a condition for pulverization is not particularly limited to a specific condition, but a pressure of air is preferably in the range of 0.5 to 1.0 MPa, and more preferably in the range of 0.6 to 0.8 MPa. Further, a speed of supplying the second component is not particularly limited to a specific value, but preferably in the range of 1 to 100 kg/h, and more preferably in the range of 3 to 50 kg/h.

As described above, the resin composition may further contain the release agent. In this case, the second component may further contain a part of the release agent in addition to the curing accelerator. Namely, the curing accelerator and the part of the release agent (small amount) thus added may be finely pulverized in the pulverizing process. This makes it possible to prevent the curing agent from adhering to a wall surface of the pulverizing machine during the pulverizing process for preparing the second powder material, even in a case where the melting temperature of a curing accelerator to be used is relatively low. As a result, it is possible to improve workability of the pulverizing process, increase an amount of the prepared second powder material as compared with a case where the second component contains only the curing accelerator and improve dispersibility of the second powder material when the second powder material is mixed with the first powder material.

Further, the second component may contain a part of the inorganic filler contained in the first component in addition to the curing accelerator. Namely, the curing accelerator and the part of the inorganic filler (small amount) thus added may be finely pulverized in the pulverizing process. This makes it possible to provide the same results as the case where the second component contains the part of the release agent and increase an amount of the second powder material. Further, since the inorganic filler has a larger specific gravity than an organic material such as a curing accelerator and is not easily melted, the curing accelerator is pulverized when the curing accelerator collides (crushes) against the inorganic filler. As a result, it is possible efficiently finely pulverize the curing accelerator.

The second component may further contain a part of the epoxy resin and/or the curing agent contained in the first component in addition to the curing accelerator. Namely, the curing accelerator and at least one of the part of the epoxy resin (small amount) and the part of the curing agent (small amount) thus added may be finely pulverized in the pulverizing process. This makes it possible to uniformly disperse and mix the first powder material and the second powder material at the mixing process (a subsequent process).

As described above, each part of the materials other than the curing accelerator may be further added to the second component. Each part of the materials to be added preferably has 1 to 3000 parts by weight with respect to 100 parts by weight of the curing accelerator, and more preferably has 3 to 2000 parts by weight with respect to 100 parts by weight of the curing accelerator.

In the following description, temperatures of the first powder material and the second powder material respectively represent temperatures of the first powder material and the second powder material which are measured just after the first powder material and the second powder material have been prepared.

(Mixing Process)

In the mixing process, the first powder material, which is prepared by pulverizing the first component containing the epoxy resin, the curing agent and the inorganic filler after the first component has been heat-melted and kneaded; and the second powder material, which is prepared by pulverizing the second component containing the curing accelerator; are dispersed and mixed with each other. The mixing process can be carried out by using a mixer selected from the group comprising a rotating type mixer such as a blade rotating type mixer, a ball mill or a ribbon blender; and a dispersed movement type mixer such as a V-type mixer, a rocking mill. These mixers can uniformly disperse and mix the first powder material and the second powder material with each other.

Further, the second powder material may be added and mixed with the first powder material at the time of preparing the first powder material by pulverizing the first component after the first component is heat-melted and kneaded (namely, at the pulverizing process for preparing the first powder material). This makes it possible to improve uniform dispersibility of the first powder material and the second powder material. In this case, both of the pulverizing process for preparing the first powder material and the mixing process for mixing the first powder material and the second powder material can be carried out in one process. As a result, it is possible to improve efficiency of overall process.

In order to carry out both of the pulverizing process for preparing the first powder material and the mixing process in one process, it is necessary to use a pulverizing machine having functions of pulverizing, dispersing and mixing. Examples of such pulverizing machine include a ball mill such as a jet mill, a vibrating ball mill, a continuous rotating ball mill or a batch type ball mill; a pot mill such as a pulverizer, a hammer mill or a planet pot mill; a roller mill or the like. Among these pulverizing machines, each of the jet mill, the ball mill, the hammer mill and the pot mill is preferably used, and the jet mill is more preferably used. This makes it possible to pulverize the kneaded first component (the kneaded material containing the heat-melted and kneaded epoxy resin, the heat-melted and kneaded curing agent and the inorganic filler) while uniformly dispersing and mixing the first powder material and the curing accelerator.

According to this method, the resin composition in which the first powder material and the second powder material are mixed with each other can be prepared. In the resin composition, the first powder material and the second powder material are dispersed in a state that the second powder material uniformly adheres to a surface of the first powder material.

Therefore, it is possible to prevent the curing accelerator contained in the second powder material from contacting with the epoxy resin and the curing agent contained in the first powder material at areas except areas where the second powder material already adheres to the surface of the first powder material. This makes it possible to reliably suppress a reaction progress between the epoxy resin and the curing agent which is caused by existence of the curing accelerator (catalyst). As a result, it is possible to store the resin composition (a mixture of the first powder material and the second powder material) at room temperature.

In a general mixing process for mixing powder materials, a temperature of the powder material to be mixed rises due to heat generated by collision (crushing) between powder materials. Therefore, in the present invention, it is preferred that a mixer in which heat is not likely to be generated by, for example, collision between the powder materials (the first powder material and the second powder material) is used and a temperature adjustment is carried out so as not to allow the powder materials to be heated at a temperature equal to or higher than the melting temperatures or the softening temperatures of the epoxy resin, the curing agent and the curing accelerator. This makes it possible to produce a resin tablet (compact) for encapsulation having superior long term storage stability at room temperature, good moldability (particularly, fluidity) and good curable property, regardless of the kind of the curing accelerator. Examples of such mixer in which the heat is not likely to be generated by, for example, the collision between the powder materials include a V-type mixer and the like. A method for adjusting the temperatures of the powder materials is not particularly limited to a specific method. Examples of the method include a direct method such as a method composed of blowing cooling medium (for example, cool air) to the kneaded material to be pulverized; and an indirect method composed of cooling a container (housing) of the mixer with cooling medium (for example, coolant or cool air). Examples of such mixer which can easily adjust the temperatures of the powder materials include a blade rotating type mixer and the like. In a case where the blade rotating type mixer is used for mixing the resin composition containing the epoxy resin, the curing agent, the curing accelerator and the inorganic filler without adjusting the temperatures of the powder materials for ten minutes, the temperatures of the powder materials (the kneaded material) rise to about 30° C. In contrast, in a case where a container (housing) of the blade rotating type mixer is cooled with cool air having a temperature of 15° C., it is possible to prevent the temperatures of the powder materials from exceeding about 25° C.

(Molding Process)

The molding process is a process for obtaining a resin compact by compression-molding (pressurizing) the resin composition prepared in the mixing process into a tablet shape or the like. By molding the resin composition into the tablet shape or the like, storage, transfer and molding of the resin composition (compact) become easier.

Examples of the method for molding the resin composition obtained in the mixing process into the tablet shape include a method composed of putting the resin composition into a molding tool having a size (diameter, height and weight) meeting requirements of user, compressing (pressurizing) the resin composition under a compression degree of 80 to 95% by using a compression-molding machine. A size of the tablet is not particularly limited to a specific size. In particular, concrete examples of the size of the tablet include a size having a diameter D of equal to or smaller than 20 mm and a ratio (L/D) of a length L divided by the diameter D of equal to or more than 1; a size having the diameter D of equal to or larger than 20 mm and the ratio (L/D) of equal to or less than 1; and the like.

In a general molding process for molding a powder material into a tablet shape, there is a case where a heating process is carried out in order to keep a shape of the obtained resin tablet and improve workablility. For example, a patent document (JP 2006-187873A) discloses a molding process for molding a mixed powder material into a tablet shape. In generally, a melting and kneading process for melting and kneading the mixed powder material is carried out. However, in the molding process of the above patent document, the melting and kneading process is not substantively carried out in order to prevent foreign substance from being mixed into a resin tablet (compact) for semiconductor encapsulation. In the process of the above patent document, it is necessary to heat the mixed powder material to a temperature of about 80 to 130° C. for obtaining predetermined fluidity and then mold the mixed powder material thus heated into the tablet shape. In contrast, in order to prevent deterioration of long term storage stability at room temperature, such heating process is not carried out during the resin composition being molded in the present invention. Since the method of the present invention includes the pulverizing process for pulverizing the curing accelerator, even in a case where the prepared resin composition is molded into the tablet shape without heating, it is possible to keep sufficient fluidity of the obtained resin compact.

Even in a case where the heating process is not actively carried out, if the molding process is continuously carried out, a temperature of the resin tablet (compact) rises due to heat generated by, for example, sliding of the powder materials. Therefore, in the present invention, it is preferred that a temperature adjustment is carried out in order to prevent the temperature of the resin tablet (compact) from rising to a temperature equal to or higher than melting temperatures or softening temperatures of the epoxy resin, the curing agent or the curing accelerator. This makes it possible to obtain the resin tablet (compact) for encapsulation having superior long term storage stability at room temperature, good moldability (more particularly, fluidity) and curable property, regardless of the kind of the curing accelerator. A method for adjusting the temperature of the resin tablet (compact) is not particularly limited to a specific method. Examples of the method include an indirect method composed of cooling a container (housing) of a mold tool with cooling medium (for example, coolant or cool air). In a case where the molding process for molding the resin composition containing the epoxy resin, the curing agent, the curing accelerator and the inorganic filler into the tablet shape is continuously carried out for one hour without adjusting the temperature of the resin tablet (compact), the temperature of the resin tablet (compact) rises to about 40° C. In contrast, in a case where the container (housing) of the mold tool is cooled with cooling liquid having a temperature of 15° C., it is possible to prevent the temperature of the resin tablet (compact) from exceeding about 25° C.

As explained above, in the method for producing the resin tablet (compact) for encapsulation of the present invention, the resin composition (the mixed powder material) containing the epoxy resin, the curing agent and the curing accelerator is not heated at the temperature equal to or higher than the melting temperatures or the softening temperatures thereof during the above processes. This makes it possible to suppress a reaction progress and eliminate the needs for storing the resin tablet (compact) in a low-temperature room for preventing the reaction progress and maintaining the stored resin tablet (compact) at room temperature before using the resin tablet (compact). Further, the resin tablet (compact) produced by the method of the present invention has less incidence of characteristic change. Therefore, even in a case where a part of the resin tablet (compact) is not used in one time, the part of the resin tablet (compact) can be used in a next time.

While the descriptions are given to the method for producing the resin tablet (compact) for encapsulation according to the present invention, the present invention is not limited thereto. The method of the present invention can be applied for producing a general epoxy resin compact (which is not for encapsulation) or the like. Further, a shape of the resin compact is not limited to the tablet shape. The shape of the resin compact may be a sheet shape, a reed shape, a pellet shape or the like.

In the resin composition and the resin compact (the resin tablet for encapsulation) of the present invention, an increasing rate of viscosity of the resin compact measured by a Koka-type flow tester (constant-load orifice-type flow tester) is preferably equal to or less than 20% after the resin composition or the resin compact is stored for thirty days at a temperature of 30° C. and a relative humidity of 50% RH, more preferably equal to or less than 10%. Such resin composition or resin compact can be obtained by the method for producing the resin composition or the resin tablet explained above.

Next, description will be given to a method for producing an electronic component device of the present invention by explaining an example case where the resin tablet for encapsulation is used as a resin compact. Examples of the method for producing the electronic component device using the resin tablet of the present invention include an encapsulating method composed of putting a lead frame or a circuit board on which an element is mounted into a mold cavity and then molding and curing the resin tablet for encapsulation with a transfer molding method, a compression-molding method or the like.

Examples of the element to be encapsulated include an integrated circuit, a large-scale integrated circuit, a transistor, a thyristor, a diode, a solid-state image sensing device, but the element to be encapsulated is not limited thereto.

Examples of the electronic component device to be obtained include a dual inline package (DIP), a plastic leaded chip carrier (PLCC), a quad flat package (QFP), a low profile quad flat package (LQFP), a small outline package (SOP), a small outline j-lead package (SOJ), a thin small outline package (TSOP), a thin quad flat package (TQFP), a tape carrier package (TCP), a ball grid array (BGA), a chip size package (CSP) and the like, but the electronic component device is not limited thereto.

The electronic component device, in which the element is encapsulated with the resin composition for encapsulation by a molding method such as the transfer molding method, may be mounted on an electronic device without change. Alternatively, the electronic component device may be mounted on the electronic device after the resin composition is completely cured by maintaining a condition of a temperature of 80 to 200° C. for a time of ten minutes to one hour.

While the descriptions are given to the method for producing the electronic component device by explaining the example case where the resin tablet for encapsulation is used, the present invention is not limited thereto. In the method of the present invention, it is possible to use the resin compact having any shapes other than the tablet shape, such as a sheet shape, a reed shape, a pellet shape or the like.

Further, by using the compression-molding method, it is possible to use a resin composition in which the pulverized curing accelerator, the pulverized epoxy resin, the pulverized curing agent and the pulverized inorganic filler are dispersed and mixed without molding into a compact. Namely, even if the molding process for molding the powder material is omitted, it is possible to use (produce) the resin composition of the present invention.

Embodiments

Hereinafter, while description is given to embodiments (examples) of the present invention, the present invention is not limited thereto. In the following tables, values described in columns for "composition ratio" are expressed in parts by weight.

Description will be given to raw materials used in examples and comparative examples. Unless otherwise noted, a particle size distribution of each of the raw materials, the first powder material and the second powder material is measured with a laser type particle size analyzer (SALD-7000 made by Shimadzu Corporation) under a condition that a refractive index D is 1.70-1.00i.

(Epoxy Resin)

Epoxy resin 1: the epoxy resin 1 is a phenol aralkyl type epoxy resin having a biphenylene chemical structure (the phenol aralkyl type epoxy resin is prepared by finely pulverizing NC-3000 made by Nipponkayaku Corporation by using a sample mill $K_{II}W$-1 made by Fujipaudal Corporation. The phenol aralkyl type epoxy resin has an epoxy equivalent of 280 g/eq, a softening temperature of 55° C., a median diameter of 200 μm. A ratio of an amount of large-sized particles having a diameter equal to or larger than 200 μm with respect to a total amount of particles of the phenol aralkyl type epoxy resin is 48 wt %.)

(Curing Agent)

Curing agent 1: the curing agent is a phenol aralkyl type epoxy resin having a biphenylene scaffold (the phenol aralkyl type epoxy resin is prepared by finely pulverizing MEH-7851 made by Meiwa kasei Corporation by using the sample mill $K_{II}W$-1 made by Fuji paudal Corporation. The phenol aralkyl type epoxy resin has an epoxy equivalent of 205 g/eq, a softening temperature of 65° C., a median diameter of 160 μm. A ratio of an amount of large-sized particles having a diameter equal to or larger than 200 μm with respect to a total amount of particles of the phenol aralkyl type epoxy resin is 33 wt %.)

(Curing Accelerator)

Curing accelerator 1: the curing accelerator 1 is a composition (adduct) of a 1,4-benzoquinone and a triphenyl phosphine represented by the following general formula (5) (the composition having a softening temperature 305° C. and a median diameter of 100 μm. A ratio of an amount of large-sized particles having a diameter equal to or larger than 50 μm with respect to a total amount of particles of the composition is 80 wt %.)

(Formula 5)

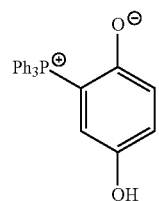

(5)

Curing accelerator 2: the curing accelerator 2 is prepared by finely pulverizing the curing accelerator 1 by using a jet mill (PJM200SP made by Nippon pneumatic Corporation) under conditions that air pressure is 0.6 MPa and speed of supplying raw materials is 3 kg/h. A median diameter of obtained particles is 3 μm and a ratio of an amount of large-sized particles having a diameter equal to or larger than 50 μm with respect to a total amount of the obtained particles is 5 wt %.

Curing accelerator 3: the curing accelerator 3 is prepared by finely pulverizing the curing accelerator 1 by using the jet mill (PJM200SP made by Nippon pneumatic Corporation) under conditions that air pressure is 1.0 MPa and speed of supplying raw materials is 1 kg/h. A median diameter of obtained particles is 2 μm and a ratio of an amount of large-sized particles having a diameter equal to or larger than 50 μm with respect to a total amount of the obtained particles is 2 wt %.

Curing accelerator 4: the curing accelerator 4 is prepared by finely pulverizing the curing accelerator 1 by using a pot mill (Pot mill II type made by Morita iron works Corporation) under conditions that a number of rotations is 60 rpm and time for pulverization is sixty minutes. A median diameter of obtained particles is 15 μm and a ratio of an amount of large-sized particles having a diameter equal to or larger than 50 μm with respect to a total amount of the obtained particles is 8 wt %.

Curing accelerator 5: the curing accelerator 5 is prepared by finely pulverizing a triphenyl phosphine (the triphenyl phosphine has a softening temperature of 80° C. and a median diameter of 70 μm, and a ratio of an amount of large-sized particles having a diameter equal to or larger than 50 μm with respect to a total amount of the triphenyl phosphine is 70 wt %) by using the jet mill (PJM200SP made by Nippon pneumatic Corporation) under conditions that air pressure is 0.6 MPa and speed of supplying raw materials is 3 kg/h. A median diameter of obtained particles is 3 μm and a ratio of an amount of large-sized particles having a diameter equal to or larger than 50 μm with respect to a total amount of the obtained particles is 5 wt %.

Curing accelerator 6: the curing accelerator 6 is prepared by finely pulverizing 3 parts by weight of the curing accelerator 1 and 0.1 parts by weight of a release agent 1 (described later) by using the jet mill (PJM200SP made by Nippon pneumatic Corporation) under conditions that air pressure is 0.6 MPa and speed of supplying raw materials is 3 kg/h. A median diameter of obtained particles is 4 μm and a ratio of an amount of large-sized particles having a diameter equal to or larger than 50 μm with respect to a total amount of the obtained particles is 6 wt %. In this case, a value of particle size distribution of a mixture of the release agent and the curing accelerator is used as a value of particle size distribution of the curing accelerator. The same goes for the following cases other than cases containing the inorganic filler.

Curing accelerator 7: the curing accelerator 7 is prepared by finely pulverizing 3 parts by weight of the curing accelerator 1 and 4.25 parts by weight of the inorganic filler 1 by using the jet mill (PJM200SP made by Nippon pneumatic Corporation) under conditions that air pressure is 0.6 MPa and speed of supplying raw materials is 3 kg/h. A median diameter of obtained particles is 3 μm and a ratio of an amount of large-sized particles having a diameter equal to or larger than 50 μm with respect to a total amount of the obtained particles is 5 wt %. In this case, a particle size distribution of the curing accelerator is calculated by subtracting a particle size distribution data of the inorganic filler from a particle size distribution data of pulverized materials.

Curing accelerator 8: the curing accelerator 8 is prepared by finely pulverizing the curing accelerator 1 by using the pot mill (Pot mill II type made by Morita iron works Corporation) under conditions that a number of rotations is 60 rpm and time for pulverization is forty minutes. A median diameter of obtained particles is 22 μm and a ratio of an amount of large-sized particles having a diameter equal to or larger than 50 μm with respect to a total amount of the obtained particles is 9 wt %.

Curing accelerator 9: the curing accelerator 9 is prepared by finely pulverizing 3 parts by weight of the curing accelerator 1 and 8 parts by weight of the epoxy resin 1 by using the jet mill (PJM200SP made by Nippon pneumatic Corporation) under conditions that air pressure is 0.6 MPa and speed of supplying raw materials is 3 kg/h. A median diameter of obtained particles is 6 μm and a ratio of an amount of large-sized particles having a diameter equal to or larger than 50 μm with respect to a total amount of the obtained particles is 7 wt %.

Curing accelerator 10: the curing accelerator 10 is prepared by finely pulverizing 3 parts by weight of the curing accelerator 1 and 5 parts by weight of the epoxy resin 1 by using the jet mill (PJM200SP made by Nippon pneumatic Corporation) under conditions that air pressure is 0.6 MPa and speed of supplying raw materials is 3 kg/h. A median diameter of obtained particles is 5 μm and a ratio of an amount of large-sized particles having a diameter equal to or larger than 50 μm with respect to a total amount of the obtained particles is 6 wt %.

Curing accelerator 11: the curing accelerator 11 is prepared by finely pulverizing 3 parts by weight of the curing accelerator 1 and 5 parts by weight of the inorganic filler 1 (described later) by using the jet mill (PJM200SP made by Nippon pneumatic Corporation) under conditions that air pressure is 0.6 MPa and speed of supplying raw materials is 3 kg/h. A median diameter of obtained particles is 3 μm and a ratio of an amount of large-sized particles having a diameter equal to or larger than 50 μm with respect to a total amount of the obtained particles is 5 wt %. In this case, a particle size distribution of the curing accelerator is calculated by subtracting a particle size distribution data of the inorganic filler from a particle size distribution data of mixed materials.

(Inorganic Filler)

Inorganic filler 1: the inorganic filler 1 is a fused silica having a spherical shape (FB560 made by Denki Kagaku Kogyo Corporation, a median diameter of the fused silica is 30 μm and a ratio of an amount of large-sized particles having a diameter equal to or larger than 200 μm with respect to a total amount of particles of the fused silica is 0 wt %)

(Other Additive Agent)

Silane coupling agent 1: a γ-glycidoxy propyltrimethoxy silane (KBM-403 made by Shin-Etu chemical Corporation)

Coloring agent 1: a carbon black (#5 made by Mitubishi chemical Corporation)

Release agent 1: a montanoic acid wax (WE 4 made by Clariant Japan Corporation)

(Producing the Resin Tablet)

Example 1

A first powder material was prepared by mixing each component described in the following table 1 other than the curing accelerator 2 at room temperature by using a blade rotating type mixer, cooling a mixture and then pulverizing the cooled mixture by using a pulverizer. A median diameter of the prepared first powder material and a ratio of an amount of large-sized particles having a diameter equal to or larger than 500 μm with respect to a total amount of particles of the prepared first powder material are shown in the table 1. Then, a resin composition was prepared by adding the curing accelerator 2 to the prepared first powder material and dispersing and mixing for five minutes by using the blade rotating type mixer. Then, a resin tablet was obtained by molding the prepared resin composition into a tablet shape by using a tablet making machine (S-20A made by Mitsubishi materials techno Corporation) under a condition that a pressure is 2 MPa. The obtained resin tablet has a compression degree of 91%, a diameter 18 mm, a height of 31.6 mm and a weight of 14.5 g. A maximum temperature of the resin composition during dispersion and mixing and a maximum temperature of the resin tablet during the resin composition being molded are shown in the table 1.

Example 2

A first powder material was prepared by mixing each component described in the following table 1 other than the curing accelerator 3 at room temperature by using a blade rotating type mixer, melting and kneading a mixture by using a heated roller having a temperature of 80 to 100° C. and then pulverizing the heated mixture by using a pulverizer. A median diameter of the prepared first powder material and a ratio of an amount of large-sized particles having a diameter equal to or larger than 500 μm with respect to a total amount of particles of the prepared first powder material are shown in the table 1. Then, a resin composition was prepared by adding the curing accelerator 3 to the prepared first powder material and dispersing and mixing for five minutes by using the blade rotating type mixer. Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 90%, a diameter of 18 mm, a height of 31.8 mm and a weight of 14.5 g. A maximum temperature of the resin composition during dispersion and mixing and a maximum temperature of the resin tablet during molding the resin composition being molded are shown in the table 1.

Example 3

A first powder material was prepared by mixing each component described in the following table 1 other than the curing accelerator 4 at room temperature by using a blade rotating type mixer, melting and kneading a mixture by using a heated roller having a temperature of 80 to 100° C. and then pulverizing the heated mixture by using a pulverizer. A median diameter of the prepared first powder material and a ratio of an amount of large-sized particles having a diameter equal to or larger than 500 μm with respect to a total amount of particles of the prepared first powder material are shown in the table 1. Then, a resin composition was prepared by adding the curing accelerator 4 to the prepared first powder material and dispersing and mixing for five minutes by using a V blender (V type mixer). Then, a resin tablet was obtained by molding the prepared resin composition into a tablet shape by using the tablet making machine (S-20A made by Mitsubishi materials techno Corporation) under a condition that a pressure is 2 MPa. The obtained resin tablet has a compression degree of 90%, a diameter of 18 mm, a height of 31.8 mm and a weight of 14.5 g. A maximum temperature of the resin composition during dispersion and mixing and a maximum temperature of the resin tablet during molding the resin composition being molded are shown in the table 1.

Example 4

A first powder material was prepared by mixing each component described in the following table 1 other than the curing accelerator 3 at room temperature by using a blade rotating type mixer, melting and kneading a mixture by using a heated roller having a temperature of 80 to 100° C., cooling the heated mixture and then pulverizing the cooled mixture by using a jet mill (under conditions that air pressure was 0.5 MPa and speed of supplying raw materials was 3 kg/h). A median diameter of the prepared first powder material and a ratio of an amount of large-sized particles having a diameter equal to or larger than 500 μm with respect to a total amount of particles of the prepared first powder material are shown in the table 1. Then, a resin composition was prepared by adding the curing accelerator 3 to the prepared first powder material and dispersing and mixing for five minutes by using the blade rotating type mixer. Then, a resin tablet was obtained by molding the prepared resin composition into a tablet shape by using the tablet making machine (S-20A made by Mitsubishi materials techno Corporation) under a condition that a pressure is 2 MPa. The obtained resin tablet has a compression degree of 88%, a diameter of 18 mm, a height of 32.5 mm and a weight of 14.5 g. A maximum temperature of the resin composition during dispersion and mixing and a maximum temperature of the resin tablet during molding the resin composition being molded are shown in the table 1.

Example 5

A first powder material was prepared by mixing each component described in the following table 1 other than the curing accelerator 6 at room temperature by using a blade rotating type mixer, melting and kneading a mixture by using a heated roller having a temperature of 80 to 100° C., cooling the heated mixture and then pulverizing the cooled mixture by using a jet mill (under conditions that air pressure was 0.5 MPa and speed of supplying raw materials was 3 kg/h). A median diameter of the prepared first powder material and a ratio of an amount of large-sized particles having a diameter equal to or larger than 500 μm with respect to a total amount of particles of the prepared first powder material are shown in the table 1. Then, a resin composition was prepared by adding the curing accelerator 6 to the prepared first powder material and dispersing and mixing for five minutes by using the blade rotating type mixer. Then, a resin tablet was obtained by molding the prepared resin composition into a tablet shape by using the tablet making machine (S-20A made by Mitsubishi materials techno Corporation) under a condition that a pressure is 2 MPa. The obtained resin tablet has a compression degree of 90%, a diameter of 18 mm, a height of 31.8 mm and a weight of 14.5 g. A maximum temperature of the resin composition during dispersion and mixing and a maximum temperature of the resin tablet during molding the resin composition being molded are shown in the table 1.

Example 6

A first powder material was prepared by mixing each component described in the following table 1 other than the curing accelerator 7 at room temperature by using a blade rotating type mixer, melting and kneading a mixture by using a heated roller having a temperature of 80 to 100° C., cooling the heated mixture and then pulverizing the cooled mixture by using a jet mill (under conditions that air pressure was 0.5 MPa and speed of supplying raw materials was 3 kg/h). A median diameter of the prepared first powder material and a ratio of an amount of large-sized particles having a diameter equal to or larger than 500 μm with respect to a total amount of particles of the prepared first powder material are shown in the table 1. Then, a resin composition was prepared by adding the curing accelerator 7 to the prepared first powder material and dispersing and mixing for five minutes by using the blade rotating type mixer. Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 90%, a diameter of 18 mm, a height of 31.8 mm and a weight of 14.5 g. A maximum temperature of the resin composition during dispersion and mixing and a maximum temperature of the resin tablet during molding the resin composition being molded are shown in the table 1.

Example 7

A first powder material was prepared by mixing each component described in the following table 1 other than the curing accelerator 2 at room temperature by using a blade rotating type mixer, melting and kneading a mixture by using a heated roller having a temperature of 80 to 100° C., cooling the heated mixture and then pulverizing the cooled mixture by using a pulverizer. A median diameter of the prepared first powder material and a ratio of an amount of large-sized particles having a diameter equal to or larger than 500 μm with respect to a total amount of particles of the prepared first powder material are shown in the table 1. Then, a resin composition was prepared by adding the curing accelerator 2 to the prepared first powder material and dispersing and mixing for five minutes by using a V blender (V type mixer). Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 90%, a diameter of 18 mm, a height of 31.8 mm and a weight of 14.5 g. A maximum temperature of the resin composition during dispersion and mixing and a maximum temperature of the resin tablet during molding the resin composition being molded are shown in the table 1.

Example 8

A first powder material was prepared by mixing each component described in the following table 1 other than the curing accelerator 5 at room temperature by using a blade rotating type mixer, melting and kneading a mixture by using a heated roller having a temperature of 80 to 100° C., cooling the heated mixture and then pulverizing the cooled mixture by using a jet mill (under conditions that air pressure was 0.5 MPa and speed of supplying raw materials was 3 kg/h). A median diameter of the prepared first powder material and a ratio of an amount of large-sized particles having a diameter equal to or larger than 500 μm with respect to a total amount of particles of the prepared first powder material are shown in the table 1. Then, a resin composition was prepared by adding the curing accelerator 5 to the prepared first powder material and dispersing and mixing for five minutes by using the blade rotating type mixer. Then, a resin tablet was obtained by molding the prepared resin composition into a tablet shape by using the tablet making machine (S-20A made by Mitsubishi materials techno Corporation) under a condition that a pressure is 2 MPa. The obtained resin tablet has a compression degree of 90%, a diameter of 18 mm, a height of 31.8 mm and a weight of 14.5 g. A maximum temperature of the resin composition during dispersion and mixing and a maximum temperature of the resin tablet during molding the resin composition being molded are shown in the table 1.

Example 9

A kneaded material was prepared by mixing each component described in the following table 1 other than the curing accelerator 2 at room temperature by using a blade rotating type mixer, melting and kneading a mixture by using a heated roller having a temperature of 80 to 100° C., and then cooling the heated mixture. Then, a first powder material was prepared by pulverizing the kneaded material by using a KRYPTON Zepros (KCM-50 made by Earthtechnica Corporation). Since the KRYPTON Zepros has more efficiently pulverizing processing ability than the jet mill and the pulverizer, and a temperature of pulverized material pulverized by using the KRYPTON Zepros does not rise, the KRYPTON Zepros is more preferable. A median diameter of the prepared first powder material and a ratio of an amount of large-sized particles having a diameter equal to or larger than 500 μm with respect to a total amount of particles of the prepared first powder material are shown in the table 1.

Then, a resin raw material powder (resin composition) was prepared by adding the curing accelerator 2 used as the second powder material to the prepared first powder material and dispersing and mixing for five minutes by using the blade rotating type mixer.

Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 91%, a diameter of 18 mm, a height of 31.6 mm and a weight of 14.5 g.

A maximum temperature of the resin composition during dispersion and mixing and a maximum temperature of the resin tablet during molding the resin composition being molded are shown in the table 1.

Example 10

A kneaded material was prepared by mixing each component described in the following table 1 other than the curing accelerator 2 at room temperature by using a blade rotating type mixer, melting and kneading a mixture by using a heated roller having a temperature of 80 to 100° C., and then cooling the heated mixture. Then, a first powder material was prepared by pulverizing the kneaded material by using a wing mill (WM-30 made by Sansho industry Corporation). Since the wing mill has more efficiently than the KRYPTON Zepros and the pulverizer and a temperature of pulverized material pulverized by using the wing mill does not rise, the wing mill is more preferable. A median diameter of the prepared first powder material and a ratio of an amount of large-sized particles having a diameter equal to or larger than 500 μm with respect to a total amount of particles of the prepared first powder material are shown in the table 1.

Then, a resin raw material powder (resin composition) was prepared by adding the curing accelerator 2 used as the second powder material to the prepared first powder material and dispersing and mixing for five minutes by using the blade rotating type mixer.

Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 91%, a diameter of 18 mm, a height of 31.6 mm and a weight of 14.5 g.

A maximum temperature of the resin composition during dispersion and mixing and a maximum temperature of the resin during molding the resin composition being molded are shown in the table 1. tablet Example 11

A kneaded material was prepared by mixing each component described in the following table 1 other than the curing accelerator 8 at room temperature by using a blade rotating type mixer, melting and kneading a mixture by using a heated roller having a temperature of 80 to 100° C., and then cooling the heated mixture. Then, a first powder material was prepared by pulverizing the kneaded material by using a pulverizer. A median diameter of the prepared first powder material and a ratio of an amount of large-sized particles having a diameter equal to or larger than 500 μm with respect to a total amount of particles of the prepared first powder material are shown in the table 1.

Then, a resin composition was prepared by adding the curing accelerator 8 used as the second powder material to the prepared first powder material and dispersing and mixing for five minutes by using a V blender (V type mixer).

Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 90%, a diameter of 18 mm, a height of 31.8 mm and a weight of 14.5 g.

A maximum temperature of the resin composition during dispersion and mixing and a maximum temperature of the resin tablet during molding the resin composition being molded are shown in the table 1.

Example 12

A kneaded material was prepared by mixing each component described in the following table 1 other than the curing accelerator 2 at room temperature by using a blade rotating type mixer, melting and kneading a mixture by using a heated roller having a temperature of 80 to 100° C., and then cooling the heated mixture. Then, a first powder material was prepared by pulverizing the kneaded material by using a jet mill (under conditions that air pressure was 0.5 MPa and speed of supplying raw materials was 3 kg/h). A median diameter of the prepared first powder material and a ratio of an amount of large-sized particles having a diameter equal to or larger than 500 μm with respect to a total amount of particles of the prepared first powder material are shown in the table 1.

Then, a resin composition was prepared by adding the curing accelerator 2 used as the second powder material to the prepared first powder material and dispersing and mixing for five minutes by using the blade rotating type mixer.

Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 90%, a diameter of 18 mm, a height of 31.8 mm and a weight of 14.5 g.

A maximum temperature of the resin composition during dispersion and mixing and a maximum temperature of the resin tablet during molding the resin composition being molded are shown in the table 1.

Example 13

A kneaded material was prepared by mixing each component described in the following table 1 other than the curing accelerator 9 at room temperature by using a blade rotating type mixer, melting and kneading a mixture by using a heated roller having a temperature of 80 to 100° C., and then cooling the heated mixture. Then, a first powder material was prepared by pulverizing the kneaded material by using a pulverizer (under conditions that air pressure was 0.5 MPa and speed of supplying raw materials was 3 kg/h). A median diameter of the prepared first powder material and a ratio of an amount of large-sized particles having a diameter equal to or larger than 500 μm with respect to a total amount of particles of the prepared first powder material are shown in the table 1.

Then, a resin composition was prepared by adding the curing accelerator 9 used as the second powder material to the prepared first powder material and dispersing and mixing for five minutes by using the blade rotating type mixer.

Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 90%, a diameter of 18 mm, a height of 31.8 mm and a weight of 14.5 g.

A maximum temperature of the resin composition during dispersion and mixing and a maximum temperature of the resin tablet during molding the resin composition being molded are shown in the table 1.

Example 14

A kneaded material was prepared by mixing each component described in the following table 1 other than the curing accelerator 10 at room temperature by using a blade rotating type mixer, melting and kneading a mixture by using a heated roller having a temperature of 80 to 100° C., and then cooling the heated mixture. Then, a first powder material was prepared by pulverizing the kneaded material by using a pulverizer (under conditions that air pressure was 0.5 MPa and speed of supplying raw materials was 3 kg/h). A median diameter of the prepared first powder material and a ratio of an amount of large-sized particles having a diameter equal to or larger than 500 μm with respect to a total amount of particles of the prepared first powder material are shown in the table 1.

Then, a resin composition was prepared by adding the curing accelerator 10 used as the second powder material to the prepared first powder material and dispersing and mixing for five minutes by using the blade rotating type mixer.

Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 90%, a diameter of 18 mm, a height of 31.8 mm and a weight of 14.5 g.

A maximum temperature of the resin composition during dispersion and mixing and a maximum temperature of the resin tablet during molding the resin composition being molded are shown in the table 1.

Example 15

A kneaded material was prepared by mixing each component described in the following table 1 other than the curing accelerator 11 at room temperature by using a blade rotating type mixer, melting and kneading a mixture by using a heated roller having a temperature of 80 to 100° C., and then cooling the heated mixture. Then, a first powder material was prepared by pulverizing the kneaded material by using a pulverizer (under conditions that air pressure was 0.5 MPa and speed of supplying raw materials was 3 kg/h). A median diameter of the prepared first powder material and a ratio of an amount of large-sized particles having a diameter equal to or larger than 500 μm with respect to a total amount of particles of the prepared first powder material are shown in the table 1.

Then, a resin composition was prepared by adding the curing accelerator 11 used as the second powder material to the prepared first powder material and dispersing and mixing for five minutes by using the blade rotating type mixer.

Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 90%, a diameter of 18 mm, a height of 31.8 mm and a weight of 14.5 g.

A maximum temperature of the resin composition during dispersion and mixing and a maximum temperature of the resin tablet during molding the resin composition being molded are shown in the table 1.

Comparative Example 1

A first powder material was prepared by mixing each component described in the following table 2 other than the curing accelerator 1 at room temperature by using a blade rotating type mixer, melting and kneading a mixture by using a heated roller having a temperature of 80 to 100° C., cooling the heated mixture and then pulverizing the cooled mixture by using a pulverizer. A median diameter of the prepared first powder material and a ratio of an amount of large-sized particles having a diameter equal to or larger than 500 μm with respect to a total amount of particles of the prepared first powder material are shown in the table 2. Then, a resin composition was prepared by adding the curing accelerator 1 to the prepared first powder material and dispersing and mixing by using a blade rotating type mixer. Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 91%, a diameter of 18 mm, a height of 31.6 mm and a weight of 14.5 g. A maximum temperature of the resin composition during dispersion and mixing and a maximum temperature of the resin tablet during molding the resin composition being molded are shown in the table 2.

Comparative Example 2

A first powder material was prepared by mixing each component described in the following table 2 other than the curing accelerator 3 at room temperature by using a blade rotating type mixer, melting and kneading a mixture by using a heated roller having a temperature of 80 to 100° C., cooling the heated mixture and then roughly pulverizing the cooled mixture. A median diameter of the prepared first powder material and a ratio of an amount of large-sized particles having a diameter equal to or larger than 500 μm with respect to a total amount of particles of the prepared first powder material are shown in the table 2. Then, a resin composition was prepared by adding the curing accelerator 3 to the prepared first powder material and dispersing and mixing by using a blade rotating type mixer. Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 91%, a diameter of 18 mm, a height of 31.6 mm and a weight of 14.5 g. A maximum temperature of the resin composition during dispersion and mixing and a maximum temperature of the resin tablet during molding the resin composition being molded are shown in the table 2.

Comparative Example 3

A resin composition was prepared by mixing each component described in the following table 2 and the curing accelerator 1 at room temperature by using a blade rotating type mixer, melting and kneading a mixture by using a heated roller having a temperature of 80 to 100° C., cooling the heated mixture and then roughly pulverizing the cooled mixture. A median diameter of the prepared resin composition was 720 μm and a ratio of an amount of large-sized particles having a diameter equal to or larger than 500 μm with respect to a total amount of particles of the prepared resin composition was 70 wt%. Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 91%, a diameter of 18 mm, a height of 31.6 mm and a weight of 14.5 g. A maximum temperature of the resin composition during dispersion and mixing and a maximum temperature of the resin tablet during molding the resin composition being molded are shown in the table 2.

Comparative Example 4

A resin composition was prepared by mixing each component described in the following table 2 and the curing accelerator 3 at room temperature by using a blade rotating type mixer, melting and kneading a mixture by using a heated roller having a temperature of 80 to 100° C., cooling the heated mixture and then roughly pulverizing the cooled mixture. A median diameter of the prepared resin composition was 750 μm and a ratio of an amount of large-sized particles having a diameter equal to or larger than 500 μm with respect to a total amount of particles of the prepared resin composition was 70 wt%. Then, a resin tablet was obtained by molding the prepared resin composition into a tablet shape by using the tablet making machine (S-20A made by Mitsubishi materials techno Corporation) under a condition that a pressure was 2 MPa. The obtained resin tablet has a compression degree of 91%, a diameter of 18 mm, a height of 31.6 mm and a weight of 14.5 g. A maximum temperature of the resin composition during dispersion and mixing and a maximum temperature of the resin tablet during molding the resin composition being molded are shown in the table 2.

The obtained resin tablets (examples 1 to 15 and comparative examples 1 to 4) were evaluated in the following method. The evaluation results are shown in the tables 1 and 2.

Evaluation Method

Fluidity (viscosity of the resin compact measured by a Koka-type flow tester): The fluidity was measured by a Koka-type flow tester (constant-load orifice-type flow tester, CFT-500 made by Shimadzu Corporation) under conditions that a temperature was 175° C., a pressure was 10 kgf/cm$^2$, a capillary diameter was 0.5 mm. A unit of the fluidity is Pa·s. The fluidities of the resin tablets were evaluated based on the following evaluation criteria.

A: The resin tablet having fluidity of equal to or lower than 20 Pa·s is evaluated as "A".

B: The resin tablet having fluidity of higher than 20 Pa·s is evaluated as "B".

Long term storage stability at a temperature of 30° C.: The long term storage stability was defined by an increasing rate of viscosity of the resin tablet. The increasing rate of the viscosity is expressed in percentage, which is calculated from a first viscosity (an initial viscosity) of the resin tablet measured before the resin tablet was stored and a second fluidity of the resin tablet measure after the resin tablet was stored for thirty days under conditions that a temperature is 30° C. and a relative humidity is 50% RH. Both of the first viscosity and the second viscosity are measured by the same method used in the above evaluation for fluidity. The long term storage stabilities of the resin tablets were evaluated based on the following evaluation criteria.

A: The resin tablet having long term storage stability of equal to or less than 20% is evaluated as "A".

B: The resin tablet having long term storage stability of higher than more than 20% is evaluated as "B".

Curable property: The curable property was defined by gel-time. The gel-time was measured by the following manner. First, the resin tablet was putted on a heated board having a temperature of 175° C. and kneaded with a spatula in speed of one stroke per sec. Then, time between the resin tablet was melted by heat and the resin tablet cured was measured. This measured time was defined as the gel-time. A unit of the gel-time is second. The curable properties of the resin tablets were evaluated based on the following evaluation criteria.

A: The resin tablet having gel-time of equal to or shorter than 50 seconds is evaluated as "A".

B: The resin tablet having gel-time of longer than 50 seconds is evaluated as "B".

Appearance: The appearance was visually evaluated in the following manner. First, the resin tablet was molded into circular test pieces by using a low-pressure transfer molding machine (KTS-30 made by Kohtaki precision machine Corporation) under condition that a temperature of a molding tool is 175° C., a transfer pressure is 9.8 MPa and a curing time is 120 s. Each of the obtained circular test pieces has a diameter of 50 mm and a thickness of 3 mm. Then, an appearance of each of the obtained circular test pieces is visually evaluated. A total of 10 circular test pieces obtained in the same example were visually evaluated for evaluating one example. The appearances of the resin tablets were evaluated based on the following evaluation criteria.

A: In a case where there is no circular test piece having voids or cracks, the resin tablet is evaluated as "A".

B: In a case where there are one or two circular test pieces having voids or cracks, the resin tablet is evaluated as "B".

C: In a case where there are three or more circular test pieces having voids or cracks, the resin tablet is evaluated as "C".

TABLE 1

| | | | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| | | | | | | | | | Examples | | | | | | | | |
| Composition ratio of resin raw material powder (parts by weight) | Epoxy resin 1 | | 78 | 78 | 78 | 78 | 78 | 78 | 78 | 78 | 78 | 78 | 78 | 78 | 70 | 78 | 78 |
| | Curing agent 1 | | 52 | 52 | 52 | 52 | 52 | 52 | 52 | 52 | 52 | 52 | 52 | 52 | 52 | 47 | 47 |
| | Curing accelerator 1 | | 3 | | | | | | | | | | | | | | |
| | Curing accelerator 2 | | | 3 | | | | | 3 | | | 3 | | 3 | | | |
| | Curing accelerator 3 | | | | 3 | | | | | | | | | | | | |
| | Curing accelerator 4 | | | | | 3 | | | | | | | | | | | |
| | Curing accelerator 5 | | | | | | 3.1 | | | | | | | | | | |
| | Curing accelerator 6 | | | | | | | 7.25 | | | | | | | | | |
| | Curing accelerator 7 | | | | | | | | | 3 | | | | | | | |
| | Curing accelerator 8 | | | | | | | | | | 3 | | | | | 8 | |
| | Curing accelerator 9 | | | | | | | | | | | | | | 11 | | |
| | Curing accelerator 10 | | | | | | | | | | | | 3 | | | | |
| | Curing accelerator 11 | | | | | | | | | | | | | | | | |
| | Inorganic filler 1 | | 850 | 850 | 850 | 850 | 850 | 845.75 | 850 | 850 | 850 | 850 | 850 | 850 | 850 | 850 | 800 |
| | Silane coupling agent 1 | | 3 | 3 | 3 | 3 | 3 | 3 | 3 | 3 | 3 | 3 | 3 | 3 | 3 | 3 | 3 |
| | Coloring agent 1 | | 3 | 3 | 3 | 3 | 3 | 3 | 3 | 3 | 3 | 3 | 3 | 3 | 3 | 3 | 3 |
| | Release agent 1 | | 1 | 1 | 1 | 1 | 0.9 | 1 | 1 | 1 | 1 | 1 | 1 | 1 | 1 | 1 | 1 |
| Method for pulverizing second powder material and particle size of curing accelerator | Added in pulverizing process | Silica | | | | | | ○ | | | | | | | | | |
| | | Releasing agent | | | | | | | | | | | | | | | |
| | | Epoxy resin | | | | | ○ | | | | | | | | | | |
| | | Curing agent | | | | ○ | | | | | | | | | | | |
| | | No addition | ○ | ○ | | | | | ○ | ○ | ○ | ○ | | ○ ○ | ○ | ○ | ○ |
| | Pulverization Method | Jet mill pulverization (Condition 1) | ○ | ○ | | | | | ○ | ○ | ○ | ○ | | | ○ | ○ | ○ |
| | | Jet mill pulverization (Condition 2) | | | | ○ | | | | | | | | ○ ○ | | | |
| | | Pot mill pulverization | | | ○ | | | | | | | | | | | | |
| | | No Finely pulverization | | | | | ○ | ○ | | | | | ○ | | | | |
| | | Speed of supplying raw materials (kg/h) | 3 | 1 | — | 1 | 3 | 3 | 3 | 3 | 3 | 3 | — | 3 | 3 | 3 | 3 |
| | | Maximum temperature of the resin composition during pulverization (°C.) | 28 | 31 | 26 | 31 | 28 | 29 | 28 | 28 | 28 | 28 | 26 | 28 | 28 | 28 | 28 |
| | Particle size | Median diameter (μm) | 3 | 2 | 15 | 2 | 4 | 3 | 3 | 3 | 3 | 3 | 22 | 3 | 6 | 5 | 3 |
| | | a ratio of an amount of large-sized particles having a diameter equal to or larger than 50 μm (wt %) | 5 | 2 | 8 | 2 | 6 | 5 | 5 | 5 | 5 | 5 | 9 | 5 | 7 | 6 | 5 |
| Method for finely pulverization method | KRYPTON Zepros pulverization | | ○ ○ | ○ | | | | | ○ ○ | ○ ○ | ○ ○ | ○ ○ | | ○ ○ | | | |
| | Wing mill pulverization | | | | | | | | | | | | | | | | |
| | Jet mill pulverization | | | ○ | ○ | ○ | ○ | ○ | | | | | ○ | | ○ | ○ | ○ |
| | Pulverizer pulverization | | | | | | | | | | | | | | | | |
| | No finely pulverization (rough pulverization) | | ○ | | ○ | | | | ○ | | | | | | | | |
| | Speed of supplying raw materials (kg/h) | | 3 | 3 | 1 | 3 | 3 | 3 | 3 | 3 | 3 | 30 | 3 | 10 | 3 | 3 | 3 |
| | Maximum temperature of composition during rough pulverization (°C.) | | 34 | 34 | 34 | 32 | 32 | 32 | 34 | 33 | 30 | 22 | 34 | 30 | 34 | 34 | 34 |
| Particle size | Median diameter (μm) | | 171 | 158 | 170 | 132 | 140 | 123 | 171 | 125 | 185 | 110 | 170 | 230 | 165 | 159 | 153 |
| | a ratio of an amount of large-sized particles having a diameter equal to or larger than 500 μm (wt %) | | 5 | 5 | 5 | 2 | 2 | 2 | 5 | 2 | 5 | 1 | 5 | 9 | 5 | 5 | 6 |
| Addition of accelerator | Curing agent is added to heated and kneaded material | | ○ | ○ | ○ | ○ | ○ | ○ | ○ | ○ | ○ | ○ | ○ | ○ | ○ | ○ | ○ |
| | Curing agent is heated and kneaded at the same time | | ○ | ○ | ○ | ○ | ○ | ○ | | | | | | | | | |
| Method for producing resin composition | Dispersion and mixing are carried out with blade rotating type mixer | | | | | | | | | | | | | | | | |
| | Dispersion and mixing are carried out with V type mixer | | ○ | ○ | ○ | ○ | ○ | ○ | ○ | ○ | ○ | ○ | ○ | ○ | ○ | ○ | ○ |
| | Maximum temperature of composition during dispersion and mixing (°C.) | | 28 | 28 | 28 | 29 | 28 | 28 | 29 | 29 | 28 | 28 | 28 | 28 | 28 | 28 | 28 |

TABLE 1-continued

| | | | 1 | 2 | 3 | 4 | 5 | 6 | Examples 7 | 8 | 9 | 10 | 11 | 12 | 13 | 14 | 15 |
|---|---|---|---|---|---|---|---|---|---|---|---|---|---|---|---|---|---|
| Maximum temperature of tablet during molding (° C.) | | | 26 | 27 | 26 | 27 | 26 | 26 | 27 | 27 | 26 | 26 | 26 | 26 | 26 | 26 | 26 |
| Evaluation results | Fluidity (viscosity measured by a Koka-type flow tester) | Viscosity (Pa·s) | 11 | 12 | 12 | 10 | 10 | 11 | 11 | 10 | 11 | 11 | 12 | 11 | 11 | 11 | 11 |
| | | Results | A | A | A | A | A | A | A | A | A | A | A | A | A | A | A |
| | Long term storage stability at a temperature of 30° C. (30° C., 50 RH %, 30 days strage) | Viscosity (Pa·s) | 11 | 12 | 12 | 9 | 9 | 12 | 11 | 10 | 11 | 11 | 12 | 10 | 10 | 10 | 10 |
| | | Increasing rate of viscosity (%) | 0 | 0 | 0 | −10 | −10 | 9 | 0 | 0 | 0 | 0 | 0 | 0 | 0 | 0 | 0 |
| | | Results | A | A | A | A | A | A | A | A | A | A | A | A | A | A | A |
| | Curable property | Gel-time at 175° C. (second) | 42 | 36 | 59 | 38 | 40 | 45 | 42 | 43 | 44 | 36 | 59 | 58 | 44 | 41 | 43 |
| | | Results | A | A | A | A | A | A | A | A | A | A | A | A | A | A | A |
| | Appearance | | A | A | A | A | A | A | A | A | A | A | A | A | A | A | A |

TABLE 2

| | | | Comparative Examples | | | |
|---|---|---|---|---|---|---|
| | | | 1 | 2 | 3 | 4 |
| Composition ratio of resin composition (parts by weight) | Epoxy resin 1 | | 78 | 78 | 78 | 78 |
| | Curing agent 1 | | 52 | 52 | 52 | 52 |
| | Curinge accelerator 1 | | | | 3 | |
| | Curinge accelerator 2 | | | | | |
| | Curinge accelerator 3 | | | | 3 | 3 |
| | Curinge accelerator 4 | | | | | |
| | Curinge accelerator 5 | | | | | |
| | Curinge accelerator 6 | | | | | |
| | Curinge accelerator 7 | | | | | |
| | Curinge accelerator 8 | | 850 | 850 | 850 | 850 |
| | Silane coupling agent 1 | | 3 | 3 | 3 | 3 |
| | Coloring agent 1 | | 3 | 3 | 3 | 3 |
| | Release agent 1 | | 1 | 1 | 1 | 1 |
| Method for pulverizing second powder material and particle size of curing accelerator | Added in pulverizing process | Silica Release agent | | | | |
| | | No addition | | ○ | | ○ |
| | Pulverization Method | Jet mill pulverization (Condition 1) | | ○ | | ○ |
| | | Jet mill pulverization (Condition 2) | | | | |
| | | Pot mill pulverization | | | | |
| | | No Finely pulverization | ○ | | ○ | |
| | | Speed of supplying raw materials (kg/h) | — | 3 | — | 3 |
| | | Maximum temperature of the resin compositon during pulverization (° C.) | — | 28 | — | 28 |
| | Particle size | Median diameter (μm) | 100 | 3 | 100 | 3 |
| | | a ratio of an amount of large-sized particles having a diameter equal to or larger than 50 μm (wt %) | 80 | 5 | 80 | 5 |
| Method for finely pulverizing heated and kneaded material of first powder material and particle size thereof | Finely pulverization methodn | KRYPTON Zepros pulverization | | | | |
| | | Wing mill pulverization | | | | |
| | | Jet mill pulverization | | | | |
| | | Pulverizer pulverization | ○ | | | |
| | | No finely pulverization (rough pulverization) | | ○ | | |
| | | Speed of supplying raw materials (kg/h) | 5 | — | — | — |
| | | Maximum temperature of compositon during rough pulverization (° C.) | 34 | — | — | — |
| | Particle size | Median diameter (μm) | 182 | 750 | | |
| | | a ratio of an amount of large-sized particles having a diameter equal to or larger than 500 μm (wt %) | 5 | 70 | | |
| Method for producing resin composition | Addition of accelerator | Curing agent is added to heated and kneaded material | ○ | ○ | | |
| | | Curing agent is heated and kneaded at the same time | | | ○ | ○ |
| | Dispersion and mixing | Dispersion and mixing are carried out with blade rotating type mixer | ○ | ○ | | |
| | | Dispersion and mixing are carried out with V type mixer | | | | |
| | | Maximum temperature of compositon during dispersion and mixing (° C.) | 28 | 28 | 28 | 28 |
| Maximum temperature of tablet during molding (° C.) | | | 27 | 26 | 27 | 27 |
| Evaluation results | Fluidity (viscosity measured by a Koka-type flow tester) | Viscosity (Pa · s) | 10 | 11 | 13 | 13 |
| | | Results | A | A | A | A |
| | Long term storage stability at a temperature of 30° C. (30° C., 50 RH %, 30 days strage) | Viscosity (Pa · s) | 10 | 11 | 18 | 26 |
| | | Increasing rate of viscosity (%) | 0 | 0 | 38 | 100 |
| | | Results | A | A | B | B |
| | Curable property | Gel-time at 175° C. (second) | 270 | 46 | 48 | 32 |
| | | Results | B | A | A | A |
| | Appearance | | B | B | A | A |

Each of examples 1 to 15 is the producing method of the present invention. Examples 1 to 15 are different from each other in points of the kind of a pulverizing machine and a condition for pulverization in the pulverizing process; a combination of the pulverizing machine and the condition for pulverization in the pulverizing process; the kind of a mixer in the mixing process and a kind of the curing accelerator. The obtained evaluation results for examples 1 to 15 are all satisfactory in all evaluation points composed of the fluidity, the long term stability at the temperature of 30°, the curable property and the appearance.

The resin tablet of the comparative example 1 was obtained in the same manner in the example 1, except that the curing accelerator did not be finely pulverized. However, the evaluation results of the curable property and the appearance are significant insufficient. Regarding the comparative example 2, each component other than the curing accelerator were heated and kneaded in the comparative example 2. Further, the first powder material prepared in the comparative example 2 had a large particle diameter. The evaluation result of the apparent was significant insufficient. Regarding the comparative example 3, the resin composition of the comparative example 3 was prepared by mixing each component described in the following table 2 and the curing accelerator. The result of the long term stability at the temperature of 30° was insufficient. This indicates that it is necessary to store the resin tablet obtained in the comparative example 3 at low-temperature. Regarding the comparative example 4, the resin composition prepared in the comparative example 4 was prepared in the same manner in the comparative example 3, except that the curing accelerator was finely pulverized. While the result of the curable property was sufficient, the result of the long term stability at the temperature of 30° C. was worst.

INDUSTRIAL APPLICABILITY

The present invention is related to a method for producing a resin compact (tablet) having superior long term storage stability at room temperature and an electronic component device using the resin tablet. The method for producing the resin compact can be applied for producing a thermosetting resin molding material such as a general epoxy resin compact (which is not for encapsulation) or the like. For the reasons stated above, the present invention is industrially applicable.

What is claimed is:

1. A method for producing a resin compact made from a resin composition containing an epoxy resin, a curing agent, a curing accelerator and an inorganic filler, the method comprising:
    a kneading and crushing process for preparing a first powder material obtained by mixing, heat-melting, kneading and crushing a first component containing the epoxy resin and the curing agent and the inorganic filler, but not containing the curing accelerator;
    a pulverizing process for preparing a second powder material obtained by pulverizing a second component containing the curing accelerator;
    a mixing process for preparing the resin composition by dispersing and mixing the first powder material and the second powder material; and
    a molding process for obtaining the resin compact by compression-molding the resin composition;
    wherein the curing accelerator contained in the second powder material comprises particles having a median diameter of equal to or smaller than 20 μm, and include large-sized particles having a diameter of equal to or larger than 50 μm, and
    wherein a ratio of an amount of the large-sized particles with respect to a total amount of the particles of the curing accelerator is equal to or less than 10%.

2. The method as claimed in claim 1, wherein temperatures of the first powder material and the second powder material are lower than melting temperatures or softening temperatures of the epoxy resin, the curing agent and the curing accelerator during the mixing process, and
    wherein a temperature of the resin composition is lower than the melting temperatures or the softening temperatures of the epoxy resin, the curing agent and the curing accelerator during the molding process.

3. The method as claimed in claim 1, wherein the resin compact is a resin tablet for encapsulation.

4. The method claimed in claim 1, wherein the kneading and crushing process is carried out by using at least one selected from the group comprising a KRYPTON Zepros, a Wing mill and a Mighty mill.

5. The method claimed in claim 1, wherein the pulverizing process is carried out by using at least one selected from the group comprising a jet mill, a boll mill, a hammer mill and a pot mill.

6. The method claimed in claim 1, wherein the resin composition further contains a release agent, and
    wherein the second powder material further contains a part of the release agent in addition to the curing accelerator.

7. The method claimed in claim 1, wherein the second component further contains a part of the inorganic filler in addition to the curing accelerator.

8. The method claimed in claim 1, wherein the second component further contains a part of epoxy resin and/or a part of the curing agent in addition to the curing accelerator.

9. The method claimed in claim 1, wherein the first powder material has a median diameter of equal to or smaller than 200 μm.

10. The method claimed in claim 1, wherein the mixing process is carried out by using at least one selected from the group comprising a rotating type mixer and a dispersed movement type mixer.

11. The method claimed in claim 1, wherein the curing accelerator contains at least one selected from the group comprising a tetra-substituted phosphonium compound, a phosphobetaine compound, an adduct of a phosphine compound and a quinone compound and an adduct of a phosphonium compound and a silane compound.

12. A resin compact obtained by the method claimed in claim 1,
    wherein an increasing rate of viscosity of the resin compact measured by a Koka-type flow tester (constant-load orifice-type flow tester) is equal to or less than 20% after the resin compact is stored for thirty days under conditions that a temperature is 30° C. and a relative humidity is 50%RH.

13. A method for producing a resin composition containing an epoxy resin, a curing agent, a curing accelerator and an inorganic filler, the method comprising:
    a kneading and crushing process for preparing a first powder material obtained by mixing, heat-melting, kneading and crushing a first component containing the epoxy resin and the curing agent and the inorganic filler, but not containing the curing accelerator;
    a pulverizing process for preparing a second powder material obtained by pulverizing a second component containing the curing accelerator; and
    a mixing process for obtaining the resin composition by dispersing and mixing the first powder material and the second powder material;
    wherein the curing accelerator contained in the second powder material comprises particles having a median diameter of equal to or smaller than 20 μm, and include large-sized particles having a diameter of equal to or larger than 50 μm, and
    wherein a ratio of an amount of the large-sized particles with respect to a total amount of the particles of the curing accelerator is equal to or less than 10%.

14. A resin composition obtained by the method claimed in claim 13,
    wherein an increasing rate of viscosity of the resin composition measured by a Koka-type flow tester (constant-load orifice-type flow tester) is equal to or less than 20% after the resin compact is stored for thirty days under conditions that a temperature is 30° C. and a relative humidity is 50%RH.

15. An electronic component device comprising:
    a semiconductor element encapsulated with the resin compact claimed in claim 12.

16. An electronic component device comprising:
    a semiconductor element encapsulated with the resin composition claimed in claim 14 without molding.

17. The method as claimed in claim 1, wherein the first powder material comprises particles having a median diameter of equal to or smaller than 200 μm and include large-sized particles having a diameter of equal to or larger than 500 μm,
    wherein a ratio of an amount of the large-sized particles with respect to a total amount of the particles of the first powder material is equal to or less than 10 wt%, and
    wherein in the mixing process, particles of the second powder material adhere to surfaces of the particles of the first powder material.

* * * * *